United States Patent
Yamaguchi et al.

(10) Patent No.: US 7,230,367 B2
(45) Date of Patent: Jun. 12, 2007

(54) PIEZOELECTRIC RESONATOR, PRODUCTION METHOD THEREOF, FILTER, DUPLEXER, AND COMMUNICATION DEVICE

(75) Inventors: Hiroshi Yamaguchi, Katano (JP); Hiroshi Nakatsuka, Katano (JP); Keiji Onishi, Settsu (JP); Takehiko Yamakawa, Suita (JP); Hiroyuki Nakamura, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 261 days.

(21) Appl. No.: 10/979,277

(22) Filed: Nov. 3, 2004

(65) Prior Publication Data

US 2005/0099093 A1    May 12, 2005

(30) Foreign Application Priority Data

Nov. 7, 2003   (JP)   ............... 2003-378257

(51) Int. Cl.
*H01L 41/04* (2006.01)
*H03H 9/70* (2006.01)

(52) U.S. Cl. ............... 310/324; 333/187; 333/189
(58) Field of Classification Search ............... 310/320, 310/324; 333/187, 189
See application file for complete search history.

(56) References Cited

U.S. PATENT DOCUMENTS 6,349,454 B1 * 2/2002 Manfra et al. ............... 29/25.35

FOREIGN PATENT DOCUMENTS

| JP | 60-68710 | 4/1985 |
|---|---|---|
| JP | 60-68711 | 4/1985 |
| JP | 2002-198758 | 7/2002 |
| JP | 2003-32060 | 1/2003 |

OTHER PUBLICATIONS

Hiroyuki Nakamura et al., U.S. Appl. No. 10/979,276, filed Nov. 3, 2004.
Hiroshi Nakatsuka et al., U.S. Appl. No. 10/979,420, filed Nov. 3, 2004.

* cited by examiner

*Primary Examiner*—Darren E. Schuberg
*Assistant Examiner*—J. San Martin
(74) *Attorney, Agent, or Firm*—Wenderoth, Lind & Ponack, L.L.P.

(57) ABSTRACT

A piezoelectric resonator includes a substrate, a lower electrode provided on or above the substrate, a piezoelectric member provided on or above the lower electrode, an upper electrode provided on or above the piezoelectric member, and a cavity provided below a vibration member including the lower electrode, the piezoelectric member, and the upper electrode. In a case where a resonance frequency of vibration with a thickness of the vibration member being a half of a wavelength is taken as $fr1$, an average of ultrasonic velocity in a material forming the cavity is taken as $Vc2$, and a value determined based on the resonance frequency $fr1$ and the average of ultrasonic velocity $Vc2$ is $\lambda c\ (=Vc2/fr1)$, a depth $t2$ of the cavity is set as, $$(2n-1) \times \frac{\lambda c}{4} - \frac{\lambda c}{8} \leq t2 \leq (2n-1) \times \frac{\lambda c}{4} + \frac{\lambda c}{8},$$

where n is an arbitrary natural number.

11 Claims, 23 Drawing Sheets

PIEZOELECTRIC RESONATOR, PRODUCTION METHOD THEREOF, FILTER, DUPLEXER, AND COMMUNICATION DEVICE

BACKGROUND OF THE INVENTION

1. Field of the Invention

The present invention relates to electronic components for use in electronic apparatuses such as mobile telephones, and more particularly to a piezoelectric resonator, a production method thereof, and a filter, a duplexer, and a communication device, which include the piezoelectric resonator.

2. Description of the Background Art

Components included in electronic apparatuses such as mobile devices are required to become more compact and lighter. For example, filters for use in mobile devices are required to be compact and accurately adjustable for frequency response.

A known filter, which satisfies the above requirements, includes a piezoelectric resonator (see, for example, pp. 2-4, and FIGS. 3 and 4 of Japanese Laid-Open Patent Publication No. 60-68711).

FIG. 18A is a cross-sectional view showing the basic structure of a conventional piezoelectric resonator. In FIG. 18A, the conventional piezoelectric resonator includes a vibration member 710 provided on a substrate 705. A cavity 704 is formed by partially etching the substrate 705 from its bottom surface using a micro machining method. The vibration member 710 includes a piezoelectric member 701, which is a primary component of the vibration member, and upper and lower electrodes 702 and 703 provided on opposite surfaces of the piezoelectric member 701.

The reason that the hollow cavity 704 is provided in the substrate 705 is to allow the vibration member 710 to vibrate.

Through the upper and lower electrodes 702 and 703 provided on the opposite surfaces of the piezoelectric member 701, electric fields are applied to the vibration member 710 in its thickness direction. This causes the vibration member 710 to vibrate in the thickness direction.

Hereinbelow, an operation of the conventional piezoelectric resonator is described with respect to vibration in the thickness direction perpendicular to an infinite plane. FIG. 18B is a schematic perspective view used for explaining the operation of the conventional piezoelectric resonator. As shown in FIG. 18B, if an electric field is applied between the upper and lower electrodes 702 and 703, electric energy is converted into mechanical energy within the piezoelectric member 701, thereby inducing mechanical vibration. The induced mechanical vibration expands in the thickness direction, so that the piezoelectric member 701 expands and contracts in the same direction as the electric field is applied.

In the case where the thickness of the vibration member 710 is t, the vibration member 710 resonates at a resonance frequency fr1(=v/λ), which corresponds to a wavelength of λ having a relationship with t such that t=λ/2, under the effect of resonant vibration of the piezoelectric member 701 in the thickness direction. Here, v is an average of ultrasonic velocity in materials composing the vibration member 710.

In the structure of the conventional piezoelectric resonator shown in FIG. 18A, the piezoelectric member 701 is allowed to vertically vibrate in the thickness direction because the cavity 704 is provided in the substrate 705.

FIG. 18C is an equivalent circuit diagram of the vibration member 710. As shown in FIG. 18C, the equivalent circuit of the vibration member 710 includes a parallel resonance circuit and a series resonance circuit. Specifically, the series resonance circuit includes a capacitor (C1), an inductor (L1), and a resistor (R1), and the parallel resonance circuit includes a capacitor (C0) connected to the series resonance circuit. Accordingly, the vibration member 710 has a resonance frequency and an anti-resonance frequency. FIG. 18D is a graph showing frequency characteristics of admittance of the equivalent circuit shown in FIG. 18C. As shown in FIG. 18D, the admittance is maximized at a resonance frequency fr1, and minimized at an anti-resonance frequency fa1. Here, the resonance frequency fr1 and the anti-resonance frequency fa1 satisfy the following relationships.

$$fr1 = \frac{1}{2\pi\sqrt{L1 \cdot C1}}$$

$$fa1 = fr\sqrt{1 + \frac{C1}{C0}}$$

It is possible to realize a compact low-loss filter which utilizes resonant vibration of a piezoelectric member if the conventional piezoelectric resonator is applied to the filter so as to take advantage of the frequency characteristics of the admittance of the vibration member 710.

In the conventional piezoelectric resonator shown in FIG. 18A, the cavity 704 (i.e., a through hole) is provided in the substrate 705, and the vibration member 710 is partially fixed on the substrate, so that the vibration member 710 is allowed to vertically vibrate in the thickness direction above the cavity.

As described above, it is known to provide the cavity 704 in a piezoelectric resonator in order to reliably cause vertical vibration in the thickness direction. In actuality, however, as shown in FIG. 18A, the vibration member 710 is partially fixed on the substrate 705, and therefore the vibration member 710 does not entirely generate free vertical vibration in the thickness direction. This can be said not only of the piezoelectric resonator as shown in FIG. 18A, where the cavity is formed to pass through the bottom surface of the substrate, but also of a piezoelectric resonator in which a cavity is formed by etching a substrate. As described above, in the conventional piezoelectric resonator, the vibration member 710 is partially fixed on the substrate, therefore the vibration member 710 is inhibited from freely vibrating, or vibration energy is caused to partially leak into the substrate. Accordingly, the conventional piezoelectric resonator has a difficulty in achieving a high Q-factor and a wide frequency range (Δf) which corresponds to a difference between the resonant frequency and the anti-resonant frequency.

FIG. 19A is an equivalent circuit diagram of a filter including a piezoelectric resonator. The filter shown in FIG. 19A includes a piezoelectric resonator 711 connected in series between input and output terminals, and a piezoelectric resonator 712 connected in parallel between the input and output terminals. FIG. 19B is a graph showing band-pass characteristics of the filter shown in FIG. 19A. In FIG. 19B, the horizontal axis indicates frequency, and the vertical axis indicates the amount of attenuation.

Similar to the conventional piezoelectric resonator, the piezoelectric resonators 711 and 712 each have a narrow frequency range Δf and a low Q-factor. In this case, the band-pass characteristic of the filter is as indicated by the dotted curve in FIG. 19B. From the dotted curve in FIG. 19B, it is found that in the case of using the piezoelectric resonators 711 and 712 each having a narrow frequency range Δf and a low Q-factor, the passband width of the filter is narrowed, while the loss of the filter is increased. Also, the amount of attenuation at attenuation poles is reduced, resulting in a reduction in steepness of slopes. As such, in the case of using the piezoelectric resonators 711 and 712 each having a narrow frequency range Δf and a low Q-factor, satisfactory filter characteristics cannot be achieved.

In comparison, consider a case where piezoelectric resonators having a wide frequency range Δf and a high Q factor are implemented. In such a case, the pass-band characteristic of the filter is as indicated by the solid curve in FIG. 19B. From the solid curve in FIG. 19B, it is found that in the case of using the piezoelectric resonators having a wide frequency range Δf and a high Q-factor, it is possible to increase the passband width of the filter compared to the case of using the piezoelectric resonators having a narrow frequency range Δf and a low Q factor. Also, the loss of the filter is reduced, and the amount of attenuation at attenuation poles is increased, resulting in an increase in steepness of slopes.

SUMMARY OF THE INVENTION

Therefore, an object of the present invention is to provide a piezoelectric resonator capable of achieving a wide frequency range Δf and a high Q-factor. Another object of the present invention is to provide a method for producing the same piezoelectric resonator. Still another object of the present invention is to provide a filter, a duplexer, and a communication device, which include the same piezoelectric resonator.

The present invention has the following features to attain the objects mentioned above. The present invention provides a piezoelectric resonator comprising: a substrate; a lower electrode provided on or above the substrate; a piezoelectric member provided on or above the lower electrode; an upper electrode provided on or above the piezoelectric member; and a cavity provided below a vibration member consisting of the lower electrode, the piezoelectric member, and the upper electrode, wherein where a resonance frequency of vibration with a thickness of the vibration member being a half of a wavelength is taken as fr1, an average of ultrasonic velocity in a material forming the cavity is taken as Vc2, and a value determined based on the resonance frequency fr1 and the average of ultrasonic velocity Vc2 is λc (=Vc2/fr1), a depth t2 of the cavity is set as shown below, $$(2n-1) \times \frac{\lambda c}{4} - \frac{\lambda c}{8} \leq t2 \leq (2n-1) \times \frac{\lambda c}{4} + \frac{\lambda c}{8},$$

where n is an arbitrary natural number.

Preferably, the depth t2 of the cavity may be set as shown below, $$(2n-1) \times \frac{\lambda c}{4} - \frac{\lambda c}{16} \leq t2 \leq (2n-1) \times \frac{\lambda c}{4} + \frac{\lambda c}{16}.$$

Alternatively, the depth t2 of the cavity may be set as shown below, $$t2 = (2n-1) \times \frac{\lambda c}{4}.$$

Preferably, the cavity may be rectangular in cross section.

Preferably, a value obtained by dividing an area of a region where an opening of the cavity overlaps the vibration member by an area of a region where the vibration member overlaps the substrate, may be equal to or more than 0.5.

Also, the present invention provides a method for producing a piezoelectric resonator, comprising: a step of providing a lower electrode on or above a substrate; a step of providing a piezoelectric member on or above the lower electrode; a step of providing an upper electrode on or above the piezoelectric member; a step of providing a cavity below a vibration member composed of the lower electrode, the piezoelectric member, and the upper electrode; and a preliminary step for determining a depth of the cavity, wherein where a resonance frequency of vibration with a thickness of the vibration member being a half of a wavelength is taken as fr1, an average of ultrasonic velocity in a material forming the cavity is taken as Vc2, and a value determined based on the resonance frequency fr1 and the average of ultrasonic velocity Vc2 is λc (=Vc2 fr1), a depth t2 of the cavity is set as shown below, $$(2n-1) \times \frac{\lambda c}{4} - \frac{\lambda c}{8} \leq t2 \leq (2n-1) \times \frac{\lambda c}{4} + \frac{\lambda c}{8},$$

where n is an arbitrary natural number.

For example, in the step of providing the cavity, the substrate is etched, and a supporting member is stacked on the substrate, so as to form a cavity having the depth determined by the preliminary step.

Alternatively, in the step of providing the cavity, a surface of the substrate may be etched to a depth more than the depth determined by the preliminary step, and an adjustment layer may be provided on the etched surface so as to form a cavity having the depth determined by the preliminary step.

Also, the present invention provides a filter including a plurality of piezoelectric resonators, at least one of which includes the above features. The present invention also provides a duplexer which comprises a filter including a plurality of piezoelectric resonators, at least one of which includes the above features. Further, the present invention provides a communication device comprising a piezoelectric resonator including the above features.

Also, the present invention provides a method for producing a piezoelectric resonator which includes: a substrate; a lower electrode provided on or above the substrate; a piezoelectric member provided on or above the lower electrode; an upper electrode provided on or above the piezoelectric member; and a cavity provided below a vibration member composed of the lower electrode, the piezoelectric member, and the upper electrode, the method comprising a step of determining a depth of the cavity such that a resonance frequency determined by a thickness of the vibration member agrees with a resonance frequency determined by a depth of the cavity.

In the piezoelectric resonator of the present invention, it is possible to realize a wide frequency range Δf (a difference between the resonance frequency and the anti-resonance frequency), and also possible to obtain a high Q-factor.

By setting the depth t2 of the cavity so as to be equal to $(2n-1) \times \lambda c/4$, the width of the frequency range $\Delta f$ and the Q-factor can be maximized.

The resonance due to the presence of the cavity is uniquely determined by forming the cavity so as to be rectangular in cross section. Therefore, it is possible to prevent the occurrence of a spurious resonance frequency, thereby providing a satisfactory frequency response.

In the case where the value obtained by dividing the area of the region where the opening of the cavity overlaps the vibration member by the area of the region where the vibration member overlaps the substrate, is equal to or more than 0.5, no spurious resonance frequency occurs between the resonance frequency and the anti-resonance frequency.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention are described with reference to the drawings.

First Embodiment

Figure 1A:
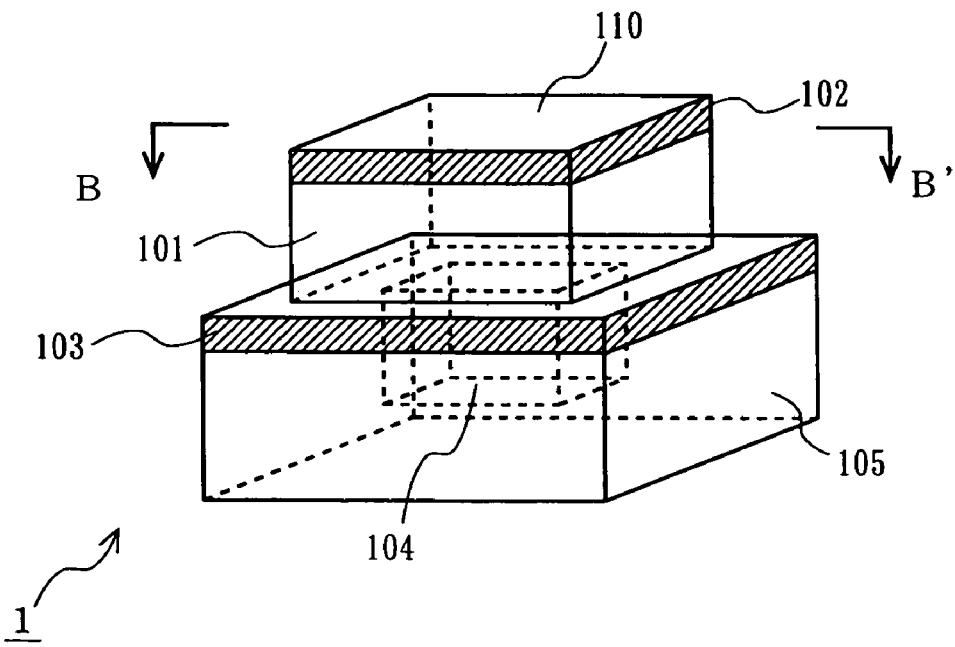
FIG. 1A is a perspective view of a piezoelectric resonator 1 according to a first embodiment of the present invention.
Figure 1B:
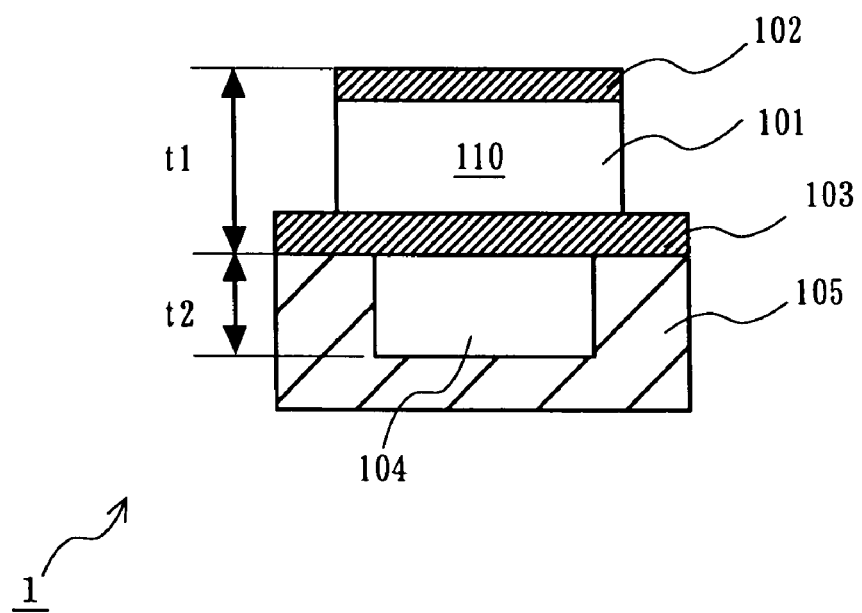
FIG. 1B is a cross-sectional view taken along line B-B of FIG. 1A.

FIG. 1A is a perspective view of a piezoelectric resonator 1 according to a first embodiment of the present invention. FIG. 1B is a cross-sectional view taken along line B-B of FIG. 1A.

In FIGS. 1A and 1B, the piezoelectric resonator 1 includes a piezoelectric member 101, an upper electrode 102, a lower electrode 103, a cavity 104, and a substrate 105.

The lower electrode 103 is formed on the substrate 105, and composed of, for example, molybdenum (Mo), tungsten (W), aluminum (Al), titanium (Ti), copper (Cu), platinum (Pt), or gold (Au).

The piezoelectric member 101 is formed on the lower electrode 103, and composed of, for example, a suitable piezoelectric material, such as zinc oxide (ZnO), lead zirconate titanate (PZT), or aluminum nitride (AlN).

The upper electrode 102 is formed on the piezoelectric member 101, and composed of, for example, molybdenum (Mo), tungsten (W), aluminum (Al), titanium (Ti), copper (Cu), platinum (Pt), or gold (Au).

The cavity 104 is formed in an upper portion of the substrate 105 underlying the lower electrode 103. The cavity 104 has a rectangular shape in cross section.

The piezoelectric member 101, and the upper and lower electrodes 102 and 103 constitute a vibration member 110 having a thickness t1. The cavity 104 has a depth t2.

Figure 2A:
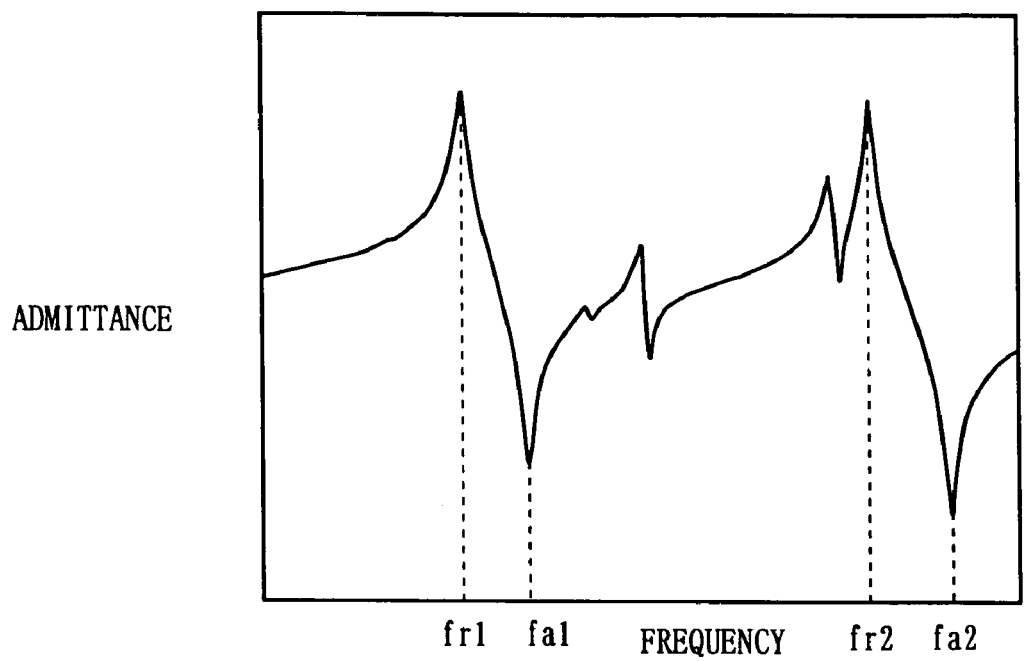
FIG. 2A is a graph showing a frequency-admittance characteristic of the piezoelectric resonator 1 in which a resonance frequency caused by vertical vibration (½ wavelength mode) of a vibration member 110 in the thickness direction is set so as to be away from a resonance frequency caused by lateral vibration (¼ wavelength mode) of a cavity 104, thereby causing no interference between the resonance frequencies.

FIG. 2A is a graph showing a frequency-admittance characteristic of the piezoelectric resonator 1 in which a resonance frequency caused by vertical vibration (½ wavelength mode) of the vibration member 110 in the thickness direction is set so as to be away from a resonance frequency caused by lateral vibration (¼ wavelength mode) of the cavity 104, thereby causing no interference between the resonance frequencies.

Resonance and anti-resonance frequencies caused by the vertical vibration (½ wavelength mode) of the vibration member 110 in the thickness direction are denoted by fr1 and fa1, respectively. Resonance and anti-resonance frequency caused by the lateral vibration (¼ wavelength mode) of the cavity 104 are denoted by fr2 and fa2, respectively.

The resonance frequency fr1 caused by the vertical vibration of the vibration member 110 in the thickness direction depends on the thickness of the vibration member 110. The resonance frequency fr2 caused by the lateral vibration of the cavity 104 depends on the depth of the cavity 104. The resonance frequency fr1 is not affected by the resonance frequency fr2 if it is sufficiently away from the resonance frequency fr2. Similarly, the resonance frequency fr2 is not affected by the resonance frequency fr1 if it is sufficiently away from the resonance frequency fr1.

Figure 2B:
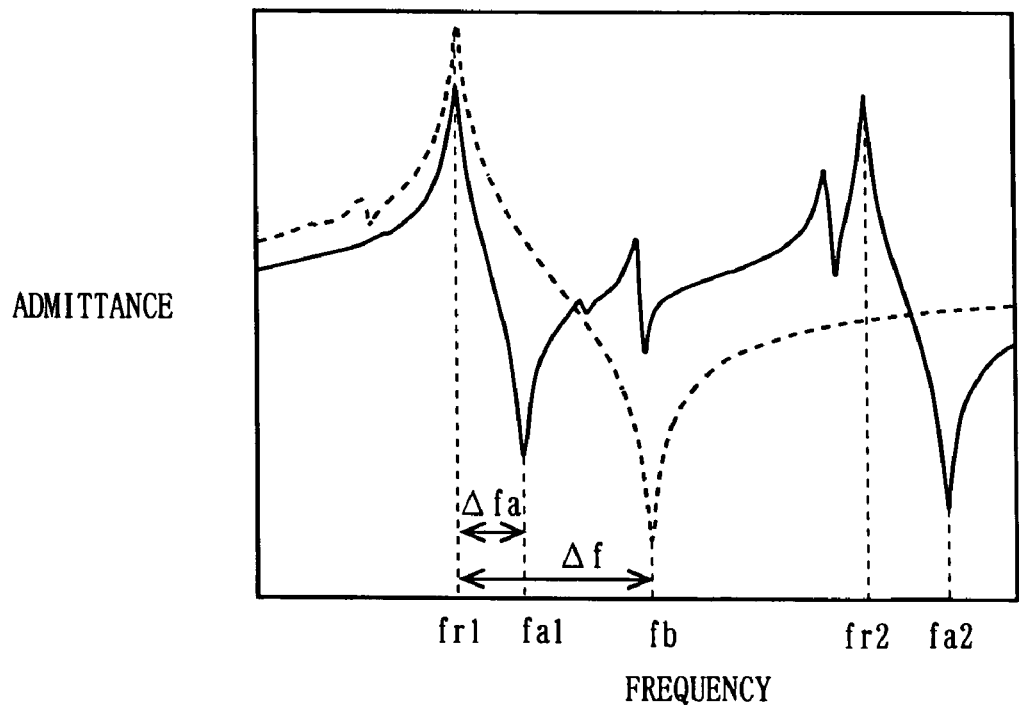
FIG. 2B is a graph in which the dotted curve indicates a frequency-admittance characteristic of the piezoelectric resonator 1 in the case where a resonance frequency fr2 is equal to a resonance frequency fr1, and the solid curve indicates the same frequency-admittance characteristic as that shown in FIG. 2A.

FIG. 2B is a graph in which the dotted curve indicates a frequency-admittance characteristic of the piezoelectric resonator 1 in the case where the resonance frequency fr2 is equal to the resonance frequency fr1, and the solid curve indicates the same frequency-admittance characteristic as that shown in FIG. 2A.

If the depth t2 of the cavity is adjusted such that the resonance frequency fr2 approximates the resonance frequency fr1, a frequency range Δf is widened and the Q-factor is increased. Accordingly, if the resonance frequency fr1 and the resonance frequency fr2 are equal to each other, it is possible to achieve the widest frequency range Δf and the highest Q-factor.

If the resonance frequency fr2 is equal to the resonance frequency fr1 with reference to the solid curve shown in FIG. 2B, the vertical vibration mode of the vibration member 110 in the thickness direction is coupled with the lateral vibration of the cavity 14, so that a new anti-resonance frequency fb occurs as indicated by the dotted curve shown in FIG. 2B. Accordingly, if the resonance frequency fr1 and the resonance frequency fr2 are equal to each other, the frequency range Δf, which corresponds to a difference between the resonance frequency fr1 and the anti-resonance frequency fb, is widened. It is appreciated that the frequency range Δf is wide compared to a frequency range Δfa corresponding to a difference between the resonance frequency fr1 and the anti-resonance frequency fa1.

Figure 3:
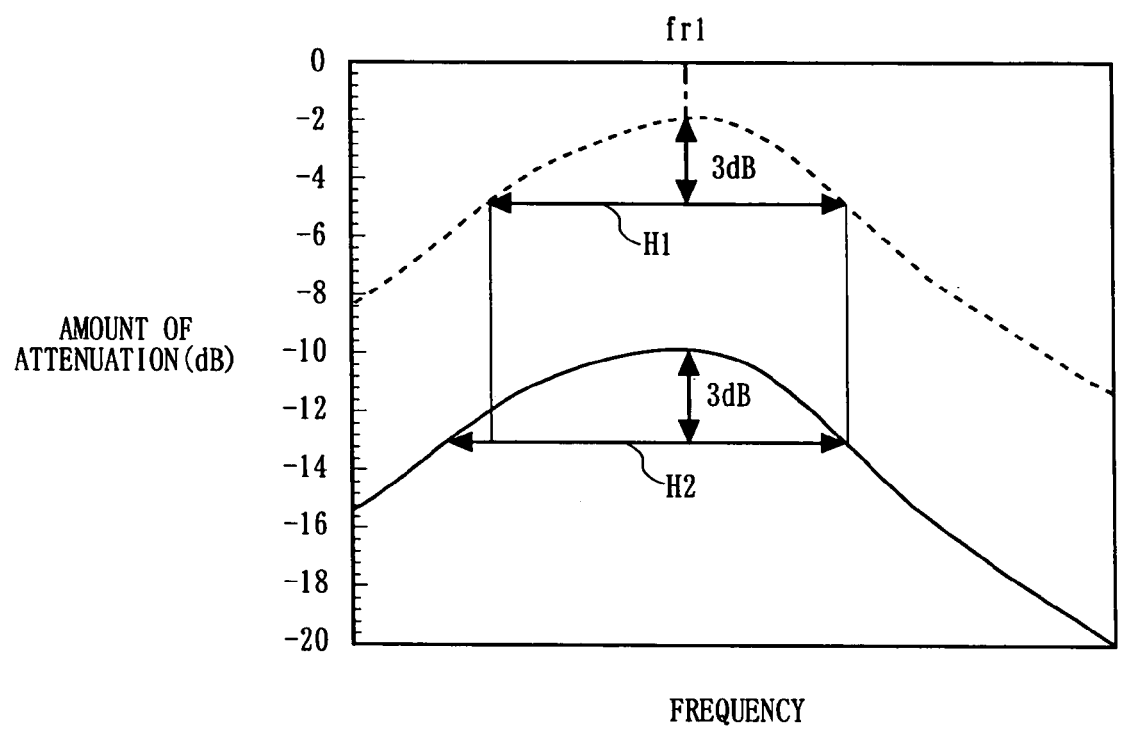
FIG. 3 is a graph showing relationships between frequencies and the amount of attenuation in the vicinity of the resonance frequency fr1 shown in FIG. 2B.

FIG. 3 is a graph showing relationships between frequencies and the amount of attenuation in the vicinity of the resonance frequency fr1 shown in FIG. 2B. In FIG. 3, the dotted curve shows a characteristic in the case where the resonance frequencies fr1 and fr2 are equal to each other (the dotted curve of FIG. 2B), while the solid curve shows a characteristic in the case where the resonance frequencies fr1 and fr2 are set so as to be away from each other, thereby causing no interference between the resonance frequencies (the solid curve of FIG. 2B).

As shown in FIG. 3, a frequency width H1, which corresponds to a 3-dB loss from the vertex of the characteristic shown by the dotted curve, is narrower than a frequency width H2, which corresponds to a 3-dB loss from the vertex of the characteristic shown by the solid curve. Accordingly, it can be said that the Q-factor of the characteristic shown by the dotted curve is higher than the Q-factor of the characteristic shown by the solid curve. The reason for this is that in the case of calculating the Q-factor, a frequency width corresponding to a 3-dB loss from the vertex of a resonance point is used as a denominator, and therefore the Q-factor becomes higher as the frequency width corresponding to a 3-dB loss becomes narrower. Thus, it is understood that a high Q-value is achieved when the resonance frequencies fr1 and fr2 are equal to each other.

Discussed next is how the depth of the cavity is set in order to make the resonance frequencies fr1 and fr2 equal to each other.

If an average of ultrasonic velocity in the vibration member 110 is Vs1, the resonance frequency fr1 is given by the expression (1).

$$fr1 = \frac{Vs1}{2 \times t1} \quad (1)$$

If an average of ultrasonic velocity in the material of the substrate 105 having the cavity 104 formed therein is Vs2, the resonance frequency fr2 is given by the following expression (2).

$$fr2 = \frac{Vs2}{4 \times t2} \quad (2)$$

If the resonance frequencies fr1 and fr2 are equal to each other based on the expressions (1) and (2), the depth t2 of the cavity 104 is given by the following expression (3).

$$t2 = \frac{Vs2}{4 \times fr1} \quad (3)$$

The wavelength λc of vibration caused in the cavity 104 due to vibration of the vibration member 110 is determined based on the resonance frequency fr1 and the average of ultrasonic velocity Vs2 in the material of the substrate 105 having the cavity 104 formed therein, and therefore can be given by the following expression (4).

$$\lambda c = \frac{Vs2}{fr1} \quad (4)$$

Based on the expressions (3) and (4), the depth t2 of the cavity 104 can be expressed by the following expression (5).

$$t2 = \frac{\lambda c}{4} \quad (5)$$

From the expression (5), it is found that if the depth t2 of the cavity 104 corresponds to a quarter of the wavelength λc in the material of the substrate 105 having the cavity 104 formed therein, the resonance frequencies fr1 and fr2 can be equal to with each other.

As is apparent from the expression (5), the bottom surface of the cavity 104 is fixed if the resonance frequencies fr1 and fr2 are equal to each other. In this case, the vertical vibration of the vibration member 110 in the thickness direction and the lateral vibration of the cavity 104 are confined in the vibration member 110 and the cavity 104. Consequently, the vertical vibration of the vibration member 110 in the thickness direction is less affected by a support member for supporting the vibration member 110 on the substrate 105, and therefore the vibration member 110 vertically vibrates in the thickness direction almost freely, making it possible to achieve a wide frequency range Δf. Also, the loss is reduced, resulting in an increase of the Q-factor.

Figure 4:
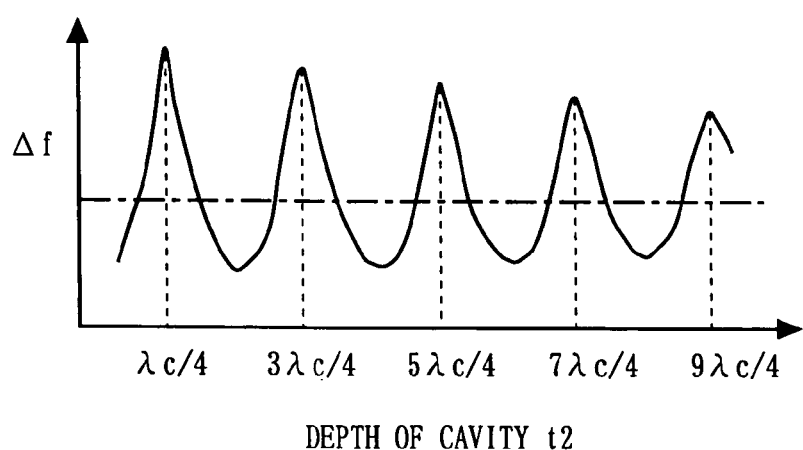
FIG. 4 is a graph showing variations of a frequency range $\Delta f$ with respect to the depth t2 of the cavity 104.

FIG. 4 is a graph showing variations of a frequency range Δf with respect to the depth t2 of the cavity 104. As shown in FIG. 4, the frequency range Δf is maximized when the depth t2 of the cavity 104 is an odd multiple of λc/4. This is because in the case where the depth t2 of the cavity 104 is an odd multiple of λc/4, the bottom surface of the cavity 104 is fixed. Accordingly, the expression (5) can be generalized to the following expression (6).

$$t2 = (2n - 1) \times \frac{\lambda c}{4}; \text{ (where } n \text{ is an integer)} \quad (6)$$

Accordingly, if the depth t2 of the cavity 104 satisfies the expression (6), it is possible to achieve a wide frequency range Δf and a high Q-factor.

The following discussion is given to explain how much the depth t2 of the cavity 104 can be changed from the condition of the expression (6), while achieving a satisfactory frequency range Δf and a satisfactory Q-factor.

Table 1 below shows frequency ranges Δf in association with changes of the depth of the cavity 104 from λc/4 in the case where the center frequency (the resonance frequency of the vibration member 20) is either at 1 GHz or at 10 GHz. Table 1 also shows, for comparison purposes, frequency ranges Δf for a conventional structure where the cavity 104 of the piezoelectric resonator 1 shown in FIG. 1 passes through the bottom surface of the substrate 15.

TABLE 1

| Cavity depth t2 | Δf at 1 GHz (MHz) | Δf at 10 GHz (MHz) | Grades |
|---|---|---|---|
| λc/16 | 8.3 | 85.2 | D |
| λc/8 | 12.2 | 128.6 | C |
| 3λc/16 | 20.1 | 197.4 | B |
| λc/4 | 23.1 | 223.3 | A |
| 5λc/16 | 19.8 | 195.5 | B |
| 3λc/8 | 12.4 | 130.3 | C |
| 7λc/16 | 8.6 | 87.8 | D |
| Through cavity (Conventional) | 11.8 | 115.5 | — |

Table 2 below shows frequency ranges Δf in association with changes of the depth of the cavity 104 from 3λc/4 in the case where the center frequency (the resonance frequency of the vibration member 20) is either at 1 GHz or at 10 GHz. Table 2 also shows, for comparison purposes, frequency ranges Δf for a conventional structure where the cavity 104 of the piezoelectric resonator 1 shown in FIG. 1 passes through the bottom surface of the substrate 15.

TABLE 2

| Cavity depth t2 | Δf at 1 GHz (MHz) | Δf at 10 GHz (MHz) | Grades |
|---|---|---|---|
| 9λc/16 | 8.5 | 85.4 | D |
| 5λc/8 | 12.3 | 128.5 | C |
| 11λc/16 | 19.3 | 189 | B |
| 3λc/4 | 21.8 | 218.3 | A |
| 13λc/16 | 19 | 191.1 | B |
| 7λc/8 | 12.4 | 129.3 | C |
| 15λc/16 | 8.7 | 88.6 | D |
| Through cavity (Conventional) | 11.8 | 115.5 | — |

Tables 1 and 2 have a "Grades" field which shows whether achieved frequency ranges Δf are wider than those achieved in the conventional structure. Grades A to C indicate that achieved frequency ranges Δf are wider than those achieved in the conventional structure. Grade D indicates that achieved frequency ranges Δf are narrower than those achieved in the conventional structure. Specifically, Grade A indicates the widest frequency ranges Δf, Grade B indicates frequency ranges Δf narrower than those in Grade A but wider than those in Grade C, and Grade C indicates frequency ranges Δf narrower than those in Grade B but wider than those in Grade D.

From Table 1, it is understood that if the depth t2 of the cavity 104 is set within a range of ±λc/8 with respect to λc/4, it is possible to provide a piezoelectric resonator which offers a wider frequency range Δf than can be offered in the case where the conventional through cavity is used.

From Table 2, it is understood that if the depth t2 of the cavity 104 is set within a range of ±λc/8 with respect to 3λc/4, it is possible to provide a piezoelectric resonator which offers a wider frequency range Δf than can be offered in the case where the conventional through cavity is used.

Thus, from Tables 1 and 2, it can be inferred that if the depth t2 of the cavity 104 is set within a range of ±λc/8 with respect to an odd multiple of λc/4 as expressed by expression (7) below, it is possible to achieve a wider frequency range Δf than can be achieved in the case where the conventional through cavity is used.

$$(2n-1) \times \frac{\lambda c}{4} - \frac{\lambda c}{8} \leq t2 \leq (2n-1) \times \frac{\lambda c}{4} + \frac{\lambda c}{8}, \tag{7}$$

where n is an arbitrary natural number.

Preferably, the depth t2 of the cavity 104 is set within a range of ±λc/16 with respect to an odd multiple of λc/4 as expressed by expression (8) below, whereby it is possible to achieve a further wider frequency range Δf.

$$(2n-1) \times \frac{\lambda c}{4} - \frac{\lambda c}{16} \leq t2 \leq (2n-1) \times \frac{\lambda c}{4} + \frac{\lambda c}{16} \tag{8}$$

Described next is a method for producing a piezoelectric resonator.

FIGS. 5A through 5G are views used for explaining the method for producing a piezoelectric resonator. Note that in FIGS. 5A through 5G, the area of a top surface of a lower electrode is the same as a base area of a piezoelectric member. However, it is also possible to produce a piezoelectric resonator, as shown in FIGS. 1A and 1B, in which the area of the top surface of the lower electrode is greater than the base area of the piezoelectric member. In FIGS. 5A through 5G, elements having functions similar to those of elements shown in FIGS. 1A and 1B are denoted by the same reference numerals.

Figure 5A:
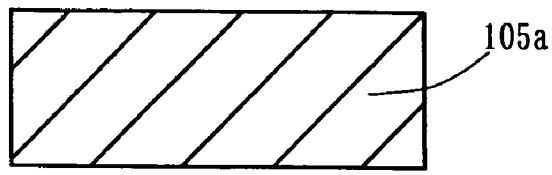
FIG. 5A is a view used for explaining a method for producing a piezoelectric resonator according to the present invention.

Firstly, as shown in FIG. 5A, a substrate 105a is prepared.

Next, a preliminary step is carried out to determine the depth t2 of the cavity 104 so as to satisfy the condition of the expression (6), (7), or (8). Specifically, the resonance frequency fr is calculated based on the thickness of the vibration member 110, the average of ultrasonic velocity Vc2 in the material of the substrate 105 having the cavity 104 formed therein is calculated, and then the wavelength λc is calculated by expression (4). Thereafter, the depth t2 of the cavity 104 is determined so as to satisfy the condition of the expression (6), (7), or (8).

Figure 5B:
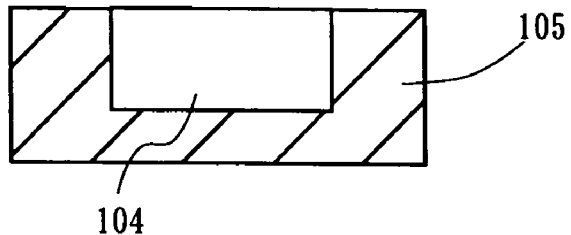
FIG. 5B is another view used for explaining the method for producing a piezoelectric resonator according to the present invention.

Next, as shown in FIG. 5B, the substrate 105a is etched to the determined depth t2, thereby forming the substrate 105 having the cavity 104 formed therein.

Figure 5C:
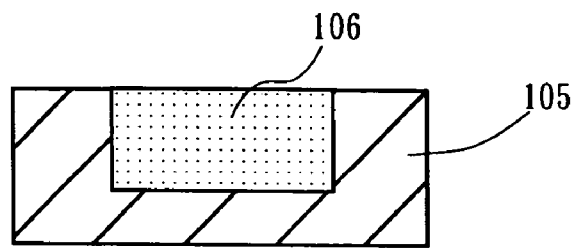
FIG. 5C is still another view used for explaining the method for producing a piezoelectric resonator according to the present invention.

Next, as shown in FIG. 5C, the cavity 104 is filled with a sacrificial layer 106 to be removed later. The sacrificial layer 106 is composed of, for example, a readily soluble material such as phosphosilicate glass (PSG).

Figure 5D:
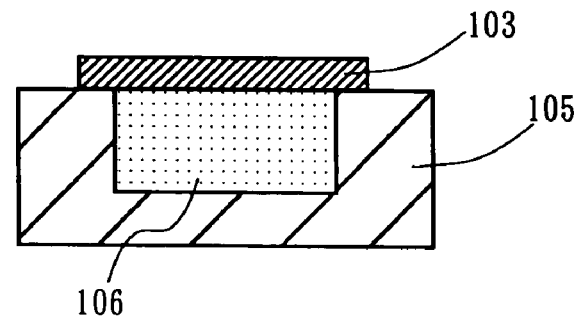
FIG. 5D is still another view used for explaining the method for producing a piezoelectric resonator according to the present invention.

Next, as shown in FIG. 5D, the lower electrode 103 is formed on the substrate 105 so as to cover the top of the cavity 104.

Figure 5E:
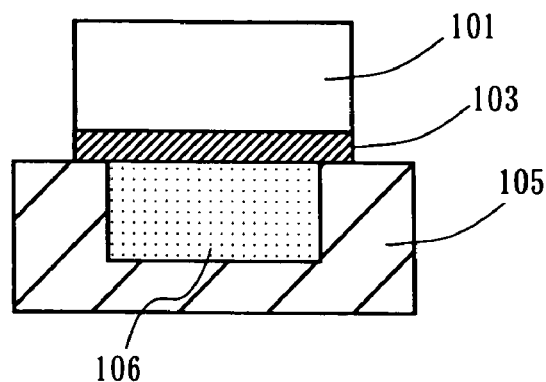
FIG. 5E is still another view used for explaining the method for producing a piezoelectric resonator according to the present invention.

Next, as shown in FIG. 5E, the piezoelectric member 101 is deposited on the lower electrode 103. The deposition is carried out by, for example, a sputtering method or a CVD method.

Figure 5F:
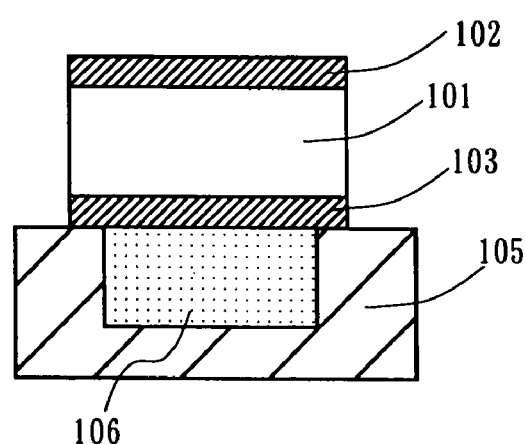
FIG. 5F is still another view used for explaining the method for producing a piezoelectric resonator according to the present invention.

Next, as shown in FIG. 5F, the upper electrode 102 is formed on the piezoelectric member 101, thereby completing the vibration member 110.

Figure 5G:
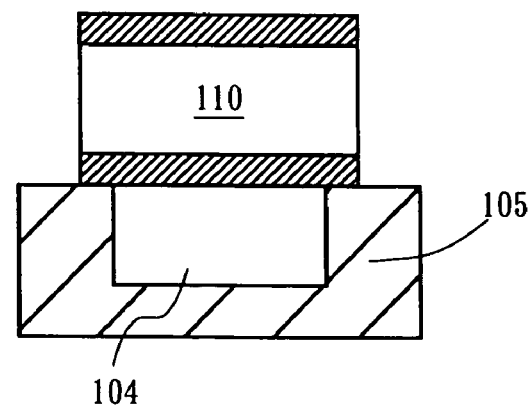
FIG. 5G is still another view used for explaining the method for producing a piezoelectric resonator according to the present invention.

Lastly, as shown in FIG. 5G, the sacrificial layer 106 is removed from the cavity 104. The removal of the sacrificial layer 106 is carried out by dissolution with an aqueous solution of hydrogen fluoride or by another method.

In the present production method, it is possible to provide a piezoelectric resonator having a wide frequency range Δf and a high Q-factor by simply determining the depth of the cavity so as to satisfy the condition of the expression (6), (7), or (8). Accordingly, no additional process is required for widening the frequency range Δf, and therefore it is possible to simplify the production process.

Second Embodiment

The structure of a piezoelectric resonator of the present invention is not limited to that described in the first embodiment. Variations of the structure will be described in a second embodiment of the present invention.

Figure 6A:
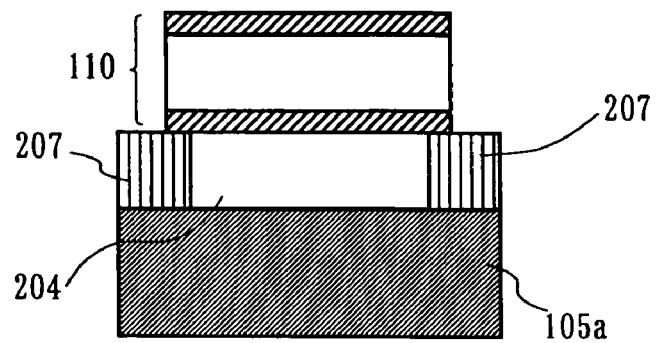
FIG. 6A is a cross-sectional view showing the structure of a piezoelectric resonator in which a cavity is formed by providing a supporting member.

FIG. 6A is a cross-sectional view showing the structure of a piezoelectric resonator in which a cavity is formed by providing a supporting member. As shown in FIG. 6A, a support member 207 is formed on a substrate 105a so as to form a cavity 204. In this manner, the lower electrode 103 is formed on the supporting member 207 above the substrate 105a. In this structure, a wide frequency range Δf and a high Q-factor can also be achieved by determining the depth of the cavity so as to satisfy the expression (6), (7), or (8). Also, since the cavity 204 is formed by depositing the supporting member 207, the depth of the cavity 204 can be accurately adjusted, achieving high production efficiency. Also, if the supporting member 207 is composed of a material with high acoustic impedance, it is possible to increase the freedom in selecting the material of the substrate 105a, while achieving an effect of reducing a spurious resonance frequency. Note that in the structure shown in FIG. 6A, the wavelength λc is determined based on an average of ultrasonic velocity Vc1 in the supporting member 207 and the substrate 105a, which compose the cavity 204, and the resonance frequency fr1 determined by the vibration member 110. Specifically, λc=Vc1/fr1.

Figure 6B:
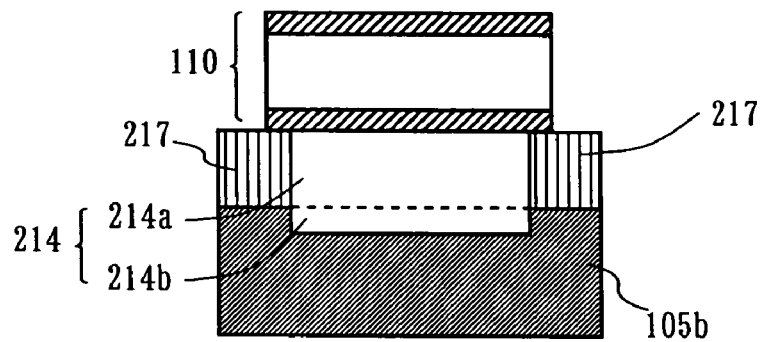
FIG. 6B is a cross-sectional view showing the structure of a piezoelectric resonator in which a cavity is formed by etching a substrate surface and providing a supporting member.

FIG. 6B is a cross-sectional view showing the structure of a piezoelectric resonator in which a cavity is formed by etching a substrate surface and providing a supporting member. As shown in FIG. 6B, a surface of a substrate 105b is etched to form a recess portion 214b, and then a supporting member 217 is formed, thereby forming a cavity portion 214a. The recess portion 214b and the cavity portion 214a constitute a cavity 214. In this structure, a wide frequency range Δf and a high Q-factor can also be achieved by determining the depth of the cavity so as to satisfy the expression (6), (7), or (8). Also, since the cavity 214 is formed by etching the surface of the substrate 105b and depositing the supporting member 217, the depth of the cavity 214 can be accurately adjusted, achieving high production efficiency. Also, if the supporting member 217 is composed of a material with high acoustic impedance, it is possible to achieve an effect of reducing a spurious resonance frequency. Note that in the structure shown in FIG. 6B, the wavelength λc is determined based on an average of ultrasonic velocity Vc2 in the supporting member 217 and the substrate 105b, which compose the cavity 214, and the resonance frequency fr1 determined by the vibration member 110. Specifically, λc=Vc2/fr1.

Figure 6C:
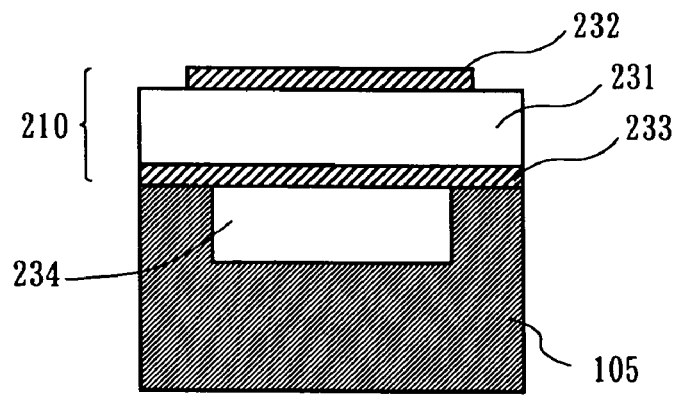
FIG. 6C is a cross-sectional view showing the structure of a piezoelectric resonator obtained by replacing a vibration member of the piezoelectric resonator shown in FIGS. 1A and 1B with a vibration member in which a top surface of a piezoelectric member 231 and a bottom surface of an upper electrode 232 are different in size from each other.
Figure 6D:
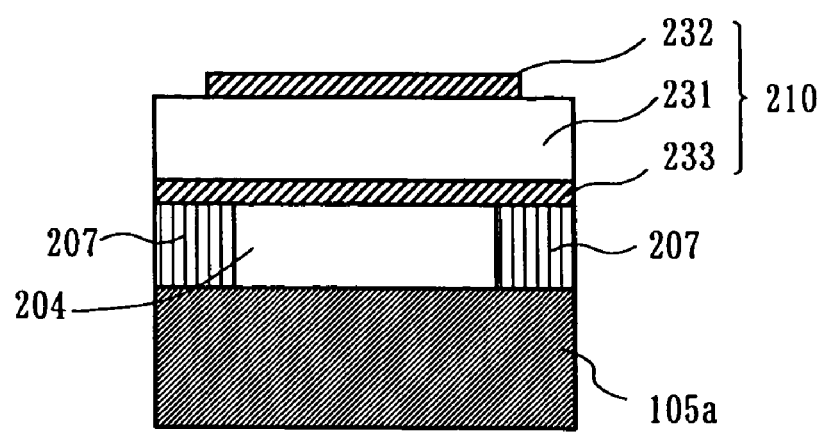
FIG. 6D is a cross-sectional view showing the structure of a piezoelectric resonator obtained by replacing a vibration member of the piezoelectric resonator shown in FIG. 6A with a vibration member in which the top surface of the piezoelectric member 231 and the bottom surface of the upper electrode 232 are different in size from each other.
Figure 6E:
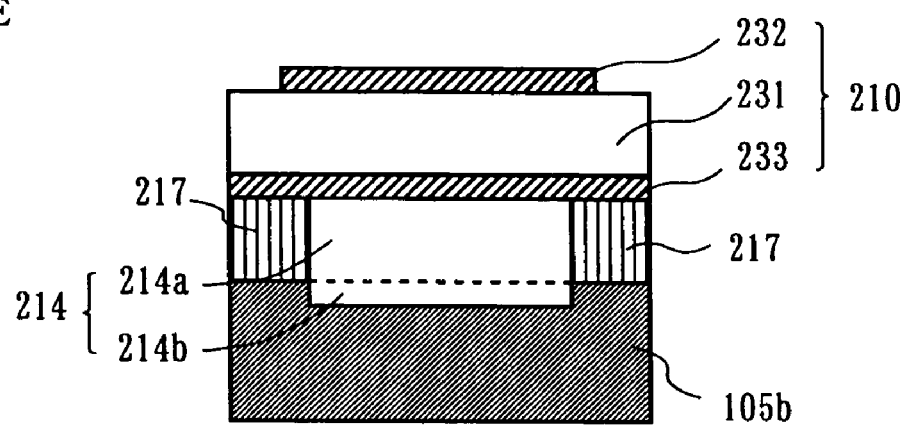
FIG. 6E is a cross-sectional view showing the structure of a piezoelectric resonator obtained by replacing a vibration member of the piezoelectric resonator shown in FIG. 6B with a vibration member in which the top surface of the piezoelectric member 231 and the bottom surface of the upper electrode 232 are different in size from each other.

FIG. 6C is a cross-sectional view showing the structure of a piezoelectric resonator obtained by replacing the vibration member 110 of the piezoelectric resonator shown in FIGS. 1A and 11B with a vibration member 210 in which a top surface of a piezoelectric member 231 and a bottom surface of an upper electrode 232 are different in size from each other. FIG. 6D is a cross-sectional view showing the structure of a piezoelectric resonator obtained by replacing the vibration member 110 of the piezoelectric resonator shown in FIG. 6A with the vibration member 210 in which the top surface of the piezoelectric member 231 and the bottom surface of the upper electrode 232 are different in size from each other. FIG. 6E is a cross-sectional view showing the structure of a piezoelectric resonator obtained by replacing the vibration member 110 of the piezoelectric resonator shown in FIG. 6B with the vibration member 210 in which the top surface of the piezoelectric member 231 and the bottom surface of the upper electrode 232 are different in size from each other.

A wide frequency range Δf and a high Q-factor can also be achieved by determining the depth of the cavity 234, 204, or 214 so as to satisfy the expression (6), (7), or (8), and by forming the vibration member 210, as shown in FIGS. 6C, 6D, and 6E, such that the top surface of the piezoelectric member 231 differs in size from the bottom surface of the upper electrode 232 and the bottom surface of the piezoelectric member 231 is equal in size to the top surface of the lower electrode 233. As in the above cases, the wavelength λc is determined based on the average of ultrasonic velocity in the material of the substrate having the cavity formed therein and the resonance frequency of the vibration member.

Note that an effect similar to that as described above can be achieved even if the bottom surface of the piezoelectric member 231 differs in size from the top surface of the lower electrode 233.

Also, note that in FIGS. 6A through 6E, elements having similar functions are denoted by the same reference numerals (this is also true of other figures). Also, elements having functions similar to those of elements shown in FIGS. 1A and 1B are denoted by the same reference numerals (this is also true of other figures).

Third Embodiment

FIGS. 7A through 7G are views used for explaining a method for producing the piezoelectric resonator shown in FIG. 6A in accordance with a third embodiment of the present invention. Hereinafter, the method for producing the piezoelectric resonator shown in FIG. 6A is described with reference to FIGS. 7A through 7G.

Figure 7A:
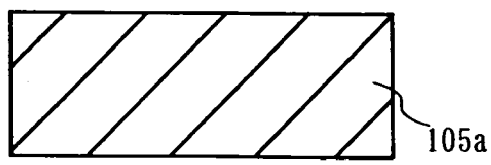
FIG. 7A is a view used for explaining a method for producing the piezoelectric resonator shown in FIG. 6A.

Firstly, as shown in FIG. 7A, the substrate 105a is prepared.

Next, a preliminary step is carried out to determine the depth t2 of the cavity 204 so as to satisfy the condition of the expression (6), (7), or (8). Specifically, the resonance frequency fr is calculated based on the thickness of the vibration member 110, the average of ultrasonic velocity Vc2 in the material of the substrate 105a having the cavity 204 formed therein is calculated, and then the wavelength λc is calculated by expression (4). Thereafter, the depth t2 of the cavity 204 is determined so as to satisfy the condition of the expression (6), (7), or (8). Also, the height of the supporting member 207 is determined so as to be equal to the determined cavity depth.

Figure 7B:
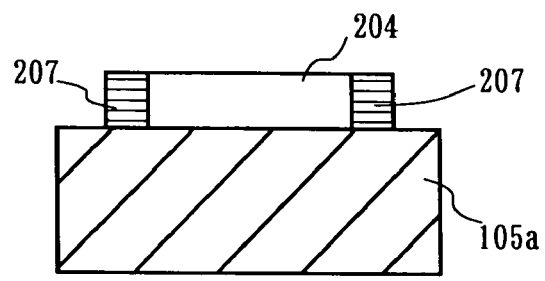
FIG. 7B is another view used for explaining the method for producing the piezoelectric resonator shown in FIG. 6A.

As shown in FIG. 7B, the supporting member 207 is formed on the top surface of the substrate 105a so as to have a height as determined.

Figure 7C:
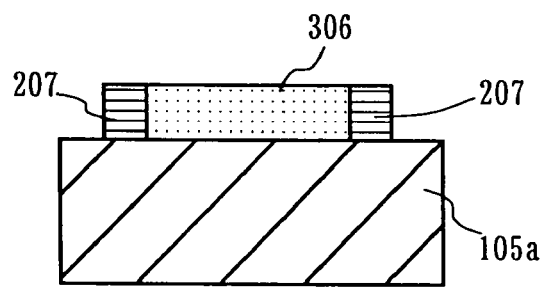
FIG. 7C is still another view used for explaining the method for producing the piezoelectric resonator shown in FIG. 6A.

Next, as shown in FIG. 7C, the supporting member 207 is filled with a sacrificial layer 306 to be removed later. The sacrificial layer 306 is composed of, for example, a readily soluble material such as phosphosilicate glass (PSG).

Figure 7D:
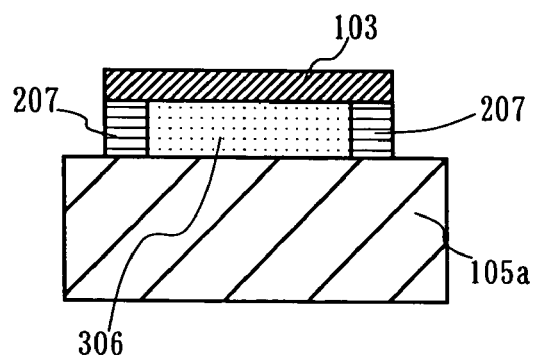
FIG. 7D is still another view used for explaining the method for producing the piezoelectric resonator shown in FIG. 6A.

Next, as shown in FIG. 7D, the lower electrode 103 is formed on the substrate 105a so as to cover the top of the supporting member 207.

Figure 7E:
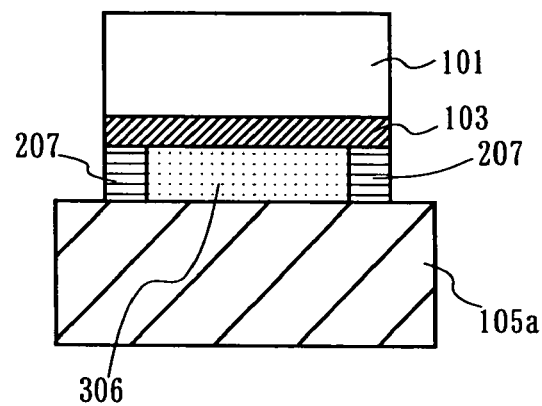
FIG. 7E is still another view used for explaining the method for producing the piezoelectric resonator shown in FIG. 6A.

Next, as shown in FIG. 7E, the piezoelectric member 101 is deposited on the lower electrode 103 above the supporting member 207 and the sacrificial layer 306. The deposition is carried out by, for example, a sputtering method or a CVD method.

Figure 7F:
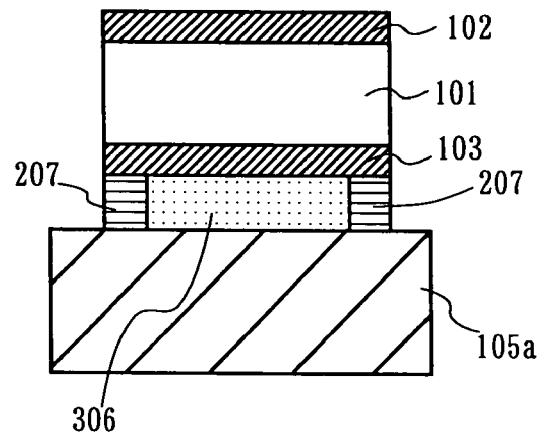
FIG. 7F is still another view used for explaining the method for producing the piezoelectric resonator shown in FIG. 6A.

Next, as shown in FIG. 7F, the upper electrode 102 is formed on the piezoelectric member 101.

Figure 7G:
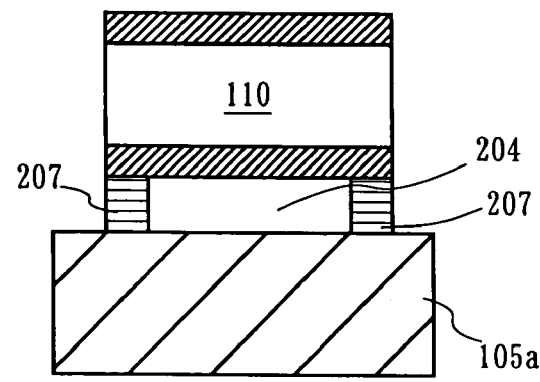
FIG. 7G is still another view used for explaining the method for producing the piezoelectric resonator shown in FIG. 6A.

Lastly, as shown in FIG. 7G, the sacrificial layer 306 is removed, thereby exposing the cavity 204. The removal of the sacrificial layer 306 is carried out by dissolution with an aqueous solution of hydrogen fluoride or by another method.

As described above, according to the third embodiment, it is possible to provide a piezoelectric resonator, which achieves a wide frequency range Δf and a high Q-factor, by simply carrying out steps of determining the depth t2 of the cavity so as to satisfy the condition of the expression (6), (7), or (8), and forming the supporting member having a height equal to the determined cavity depth. Accordingly, no additional process is required for widening the frequency range Δf and increasing the Q-value. Therefore, it is possible to simplify the production process.

Fourth Embodiment

FIGS. 8A through 8G are views used for explaining a method for producing the piezoelectric resonator shown in FIG. 6B in accordance with a fourth embodiment of the present invention. Hereinafter, the method for producing the piezoelectric resonator shown in FIG. 6B is described with reference to FIGS. 8A through 8G.

Figure 8A:
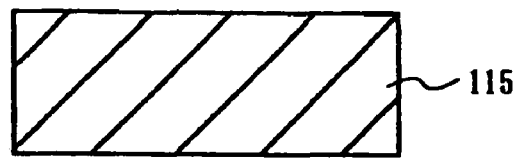
FIG. 8A is a view used for explaining a method for producing the piezoelectric resonator shown in FIG. 6B.

Firstly, as shown in FIG. 8A, the substrate 115 is prepared.

Next, a preliminary step is carried out to determine the depth t2 of the cavity 214 so as to satisfy the condition of the expression (6), (7), or (8). Specifically, the resonance frequency fr is calculated based on the thickness of the vibration member 110, the average of ultrasonic velocity Vc2 in the material of the substrate 115 having the cavity 214 formed therein is calculated, and then the wavelength λc is calculated by expression (4). Thereafter, the depth t2 of the cavity 214 is determined so as to satisfy the condition of the expression (6), (7), or (8). Hereinafter, in the fourth embodiment, the determined cavity depth is referred to as a "set value".

Figure 8B:
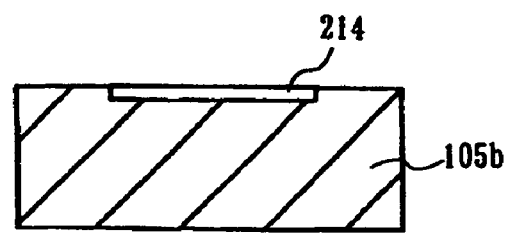
FIG. 8B is another view used for explaining the method for producing the piezoelectric resonator shown in FIG. 6B.

Next, as shown in FIG. 8B, the top surface of a substrate 115 is etched to form the substrate 105b and the recess portion 214b.

Figure 8C:
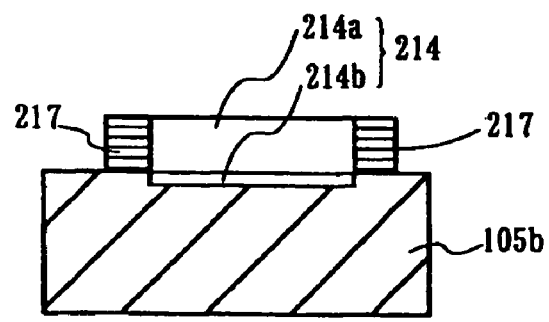
FIG. 8C is still another view used for explaining the method for producing the piezoelectric resonator shown in FIG. 6B.

Next, as shown in FIG. 8C, the supporting member 217 is formed around the etched region. At this point, the height of the supporting member 217 is adjusted such that the depth of the cavity 214 composed of the recess portion 214b and the cavity portion 214a becomes equal to the set value.

Figure 8D:
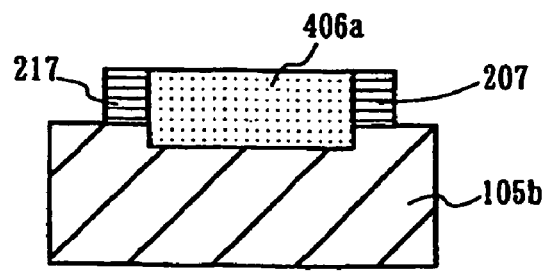
FIG. 8D is still another view used for explaining the method for producing the piezoelectric resonator shown in FIG. 6B.

Next, as shown in FIG. 8D, the cavity 214 is filled with a sacrificial layer 406a to be removed later. The sacrificial layer 406a is composed of, for example, a readily soluble material such as phosphosilicate glass (PSG).

Figure 8E:
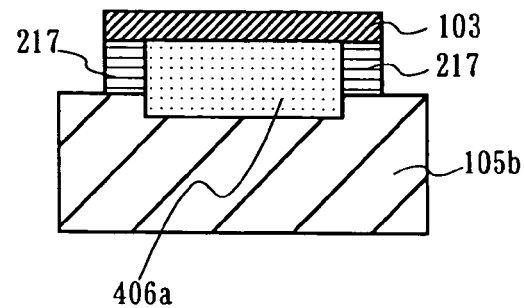
FIG. 8E is still another view used for explaining the method for producing the piezoelectric resonator shown in FIG. 6B.

Next, as shown in FIG. 8E, the lower electrode 103 is formed so as to cover the top of the supporting member 217 and the top of the sacrificial layer 406a in the cavity 214.

Figure 8F:
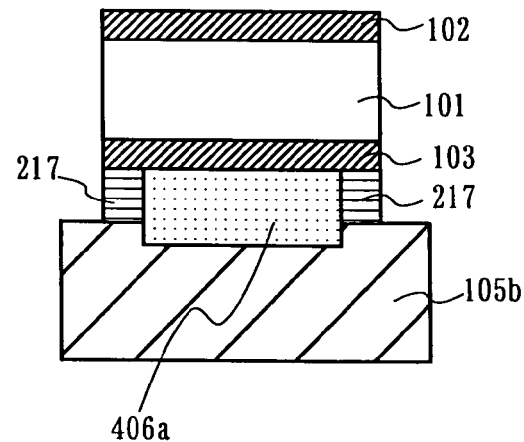
FIG. 8F is still another view used for explaining the method for producing the piezoelectric resonator shown in FIG. 6B.

Next, as shown in FIG. 8F, the piezoelectric member 101 is deposited on the lower electrode 103, and the upper electrode 102 is deposited on the piezoelectric member 101. The deposition is carried out by, for example, a sputtering method or a CVD method.

Figure 8G:
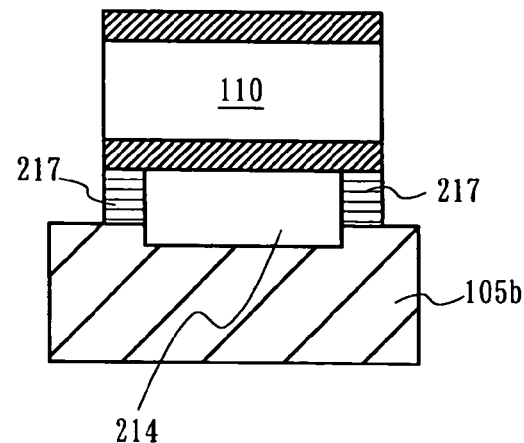
FIG. 8G is still another view used for explaining the method for producing the piezoelectric resonator shown in FIG. 6B.

Lastly, as shown in FIG. 8G, the sacrificial layer 406a is removed, thereby exposing the cavity 214. The removal of the sacrificial layer 406a is carried out by dissolution with an aqueous solution of hydrogen fluoride or by another method.

As described above, according to the fourth embodiment, it is possible to provide a piezoelectric resonator, which achieves a wide frequency range Δf and a high Q-factor, by simply carrying out steps of determining the depth t2 of the cavity 214 so as to satisfy the condition of the expression (6), (7), or (8), and forming the supporting member 217 having a height equal to the determined cavity depth. Accordingly, no additional process is required for widening the frequency range Δf and increasing the Q-value, and therefore it is possible to simplify the production process.

Note that the piezoelectric resonators shown in FIGS. 6C, 6D, and 6E can be produced by the production methods described in conjunction with FIGS. 6A through 8G if the lower electrode and the piezoelectric member are changed in size.

Fifth Embodiment

A piezoelectric resonator according to a fifth embodiment of the present invention differs from the piezoelectric resonator according to the first embodiment in that an adjustment layer for adjusting a cavity depth is provided on the bottom of a cavity formed by etching a substrate.

FIGS. 9A through 9H are views used for explaining a method for producing the piezoelectric resonator according to the fifth embodiment. Hereinafter, the method for producing the piezoelectric resonator according to the fifth embodiment is described with reference to FIGS. 9A through 9H.

Figure 9A:
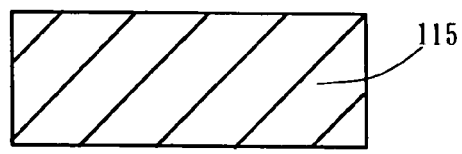
FIG. 9A is a view used for explaining a method for producing a piezoelectric resonator according to a fifth embodiment of the present invention.

Firstly, as shown in FIG. 9A, the substrate 115 is prepared.

Next, a preliminary step is carried out to determine the depth t2 of a cavity 504b so as to satisfy the condition of the expression (6), (7), or (8). Specifically, the resonance frequency fr is calculated based on the thickness of the vibration member 110, the average of ultrasonic velocity Vc2 in the material of the substrate 115 having the cavity 504b formed therein is calculated, and then the wavelength λc is calculated by expression (4). Thereafter, the depth t2 of the cavity 504b is determined so as to satisfy the condition of the expression (6), (7), or (8). Hereinafter, in the fifth embodiment, the determined cavity depth is referred to as a "set value".

Figure 9B:
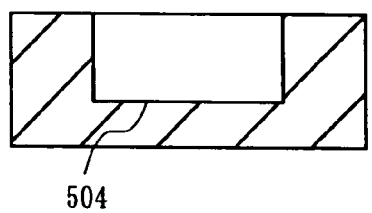
FIG. 9B is another view used for explaining the method for producing the piezoelectric resonator according to the fifth embodiment of the present invention.

Next, as shown in FIG. 9B, the substrate 115 is partially etched to form a recess portion 504. In this case, the depth of the recess portion 504 is greater than the set value.

Figure 9C:
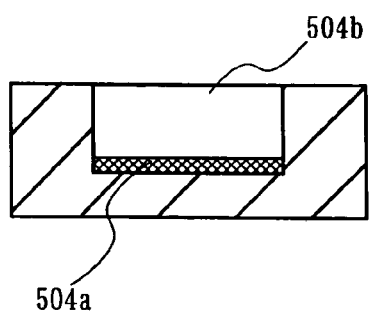
FIG. 9C is still another view used for explaining the method for producing the piezoelectric resonator according to the fifth embodiment of the present invention.

Next, as shown in FIG. 9C, a cavity depth adjustment layer 504a is formed on the bottom of the recess portion 504. In this case, the thickness of the cavity depth adjustment layer 504a is adjusted such that the depth of the cavity 504b becomes equal to the set value.

Figure 9D:
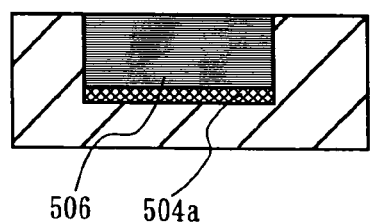
FIG. 9D is still another view used for explaining the method for producing the piezoelectric resonator according to the fifth embodiment of the present invention.

Next, as shown in FIG. 9D, the cavity 504b is filled with a sacrificial layer 506 to be removed later. The sacrificial layer 506 is composed of, for example, a readily soluble material such as phosphosilicate glass (PSG).

Figure 9E:
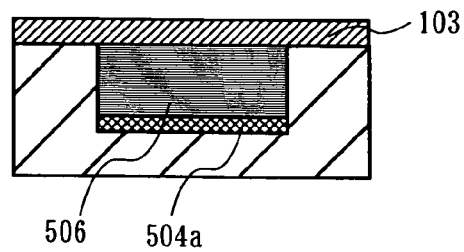
FIG. 9E is still another view used for explaining the method for producing the piezoelectric resonator according to the fifth embodiment of the present invention.

Next, as shown in FIG. 9E, the lower electrode 103 is deposited so as to cover the top of the sacrificial layer 506 in the cavity 504b.

Figure 9F:
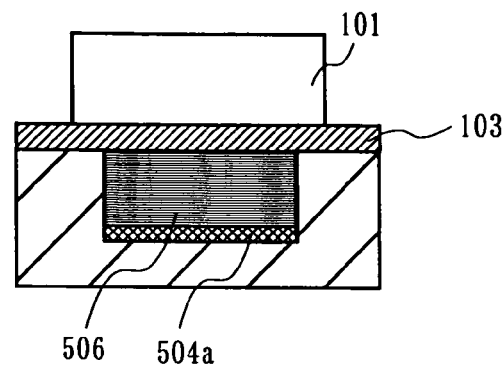
FIG. 9F is still another view used for explaining the method for producing the piezoelectric resonator according to the fifth embodiment of the present invention.

Next, as shown in FIG. 9F, the piezoelectric member 101 is deposited on the lower electrode 103.

Figure 9G:
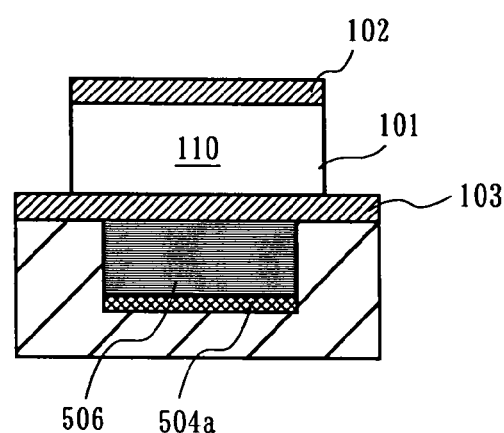
FIG. 9G is still another view used for explaining the method for producing the piezoelectric resonator according to the fifth embodiment of the present invention.

Next, as shown in FIG. 9G, the upper electrode 102 is deposited on the piezoelectric member 101. The deposition is carried out by, for example, a sputtering method or a CVD method.

Figure 9H:
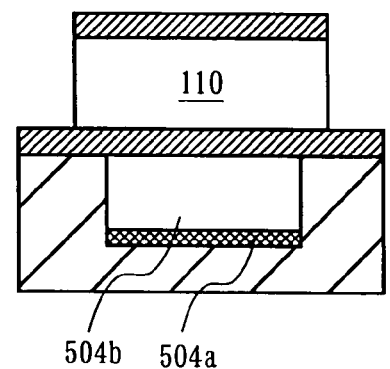
FIG. 9H is still another view used for explaining the method for producing the piezoelectric resonator according to the fifth embodiment of the present invention.

Lastly, as shown in FIG. 9H, the sacrificial layer 506 is removed, thereby exposing the cavity 504b. The removal of the sacrificial layer 506 is carried out by dissolution with an aqueous solution of hydrogen fluoride or by another method.

As described above, according to the fifth embodiment, it is possible to provide a piezoelectric resonator, which achieves a wide frequency range Δf and a high Q-factor, by simply carrying out steps of determining the depth t2 of the cavity 504b so as to satisfy the condition of the expression (6), (7), or (8), and forming the adjustment layer 504a, thereby forming the cavity 504b having a predetermined depth. Accordingly, no additional process is required for widening the frequency range Δf and increasing the Q-value, therefore it is possible to simplify the production process.

Sixth Embodiment

In a sixth embodiment of the present invention, examples of designing a cavity depth are described with illustration of materials of a substrate having a cavity formed therein.

Table 3 below shows ranges of the depth of the cavity in the case where Si, SiO2, or SiN is used as the material of the substrate and the resonance frequency is at 2 GHz.

TABLE 3

| Substrate material | Cavity depth t2 [μm] |
| --- | --- |
| Si | 0.42-1.26, 2.12-2.95, 3.81-4.63, . . . |
| SiN | 0.43-1.27, 2.14-2.97, 3.84-4.67, . . . |
| SiO2 | 0.39-1.18, 2.00-2.77, 3.59-4.36, . . . |

It is possible to design a piezoelectric resonator, which achieves a wide frequency range Δf and a high Q-factor, by determining the wavelength λc based on the average of ultrasonic velocity in the material of the substrate and the resonance frequency, and by determining a cavity depth range using the expression (7).

Note that in the case of using a substrate material other than those shown above, the density of the material and Young's modulus are used to derive the average of ultrasonic velocity in the material, and there by to readily determine the depth of a cavity.

Also, in the case where a desired resonance frequency is different from that as shown above, if the desired resonance frequency is f, the depth of a cavity for the desired resonance frequency can be obtained by multiplying the cavity depth shown in Table 3 by 2/f GHz. For example, in the case where the desired resonance frequency f is 4 GHz, the depth of a cavity therefor can be obtained by multiplying the cavity depth shown in Table 3 by 2/4 GHz. For example, in the case of using a Si substrate, the cavity depth is in the following ranges: 0.21-0.63, 1.06-1.47, 1.91-2.31, . . . .

Seventh Embodiment

In a seventh embodiment of the present invention, a discussion is given as to how much a cavity and a vibration member are required to overlap each other in the case of designing a piezoelectric resonator in which vertical vibration of the vibration member in its thickness direction and lateral vibration of the cavity are confined in the cavity such that no spurious resonance frequency occurs between the resonance frequency and the anti-resonance frequency.

Figure 10:
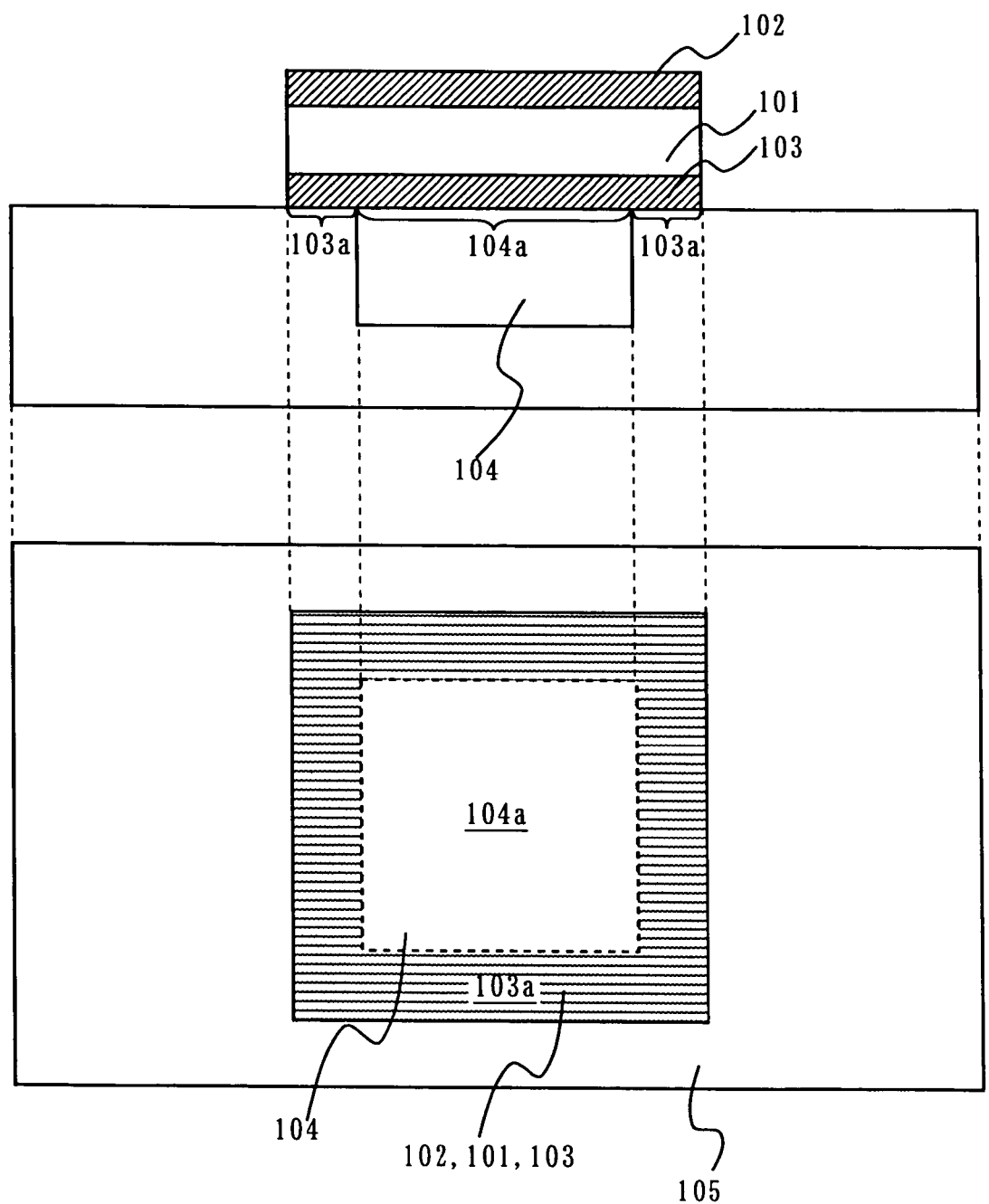
FIG. 10 shows cross-sectional and top views of a piezoelectric resonator.

FIG. 10 shows cross-sectional and top views of a piezoelectric resonator. Hereinbelow, the definition of degree α of over lap between the cavity and the vibration member is described with reference to FIG. 10. In the piezoelectric resonator shown in FIG. 10, unlike in the piezoelectric resonator shown in FIG. 1A, the lower electrode 103 is provided in a size corresponding to the bottom surface of the piezoelectric member 101. However, the seventh embodiment is applicable to the case as shown in FIG. 1A, where the lower electrode is provided on the entire top surface of the substrate 105.

Here, an opening 104a of the cavity, which overlaps the vibration member, has an area of A. In FIG. 10, a region corresponding to the area of A is indicated by a dotted square. A region 103a, where the lower electrode 103 overlaps the substrate 105, has an area of B. More specifically, in the region 103a, the vibration member consisting of the piezoelectric member 101, the upper electrode 102, and the lower electrode 103 overlap the substrate 105. The area of B of the region 103a, where the vibration member overlaps the substrate 105, corresponds to the size of an area remaining after the area of A of the opening 104a of the cavity is subtracted from the base area of the vibration member, i.e., the base area of the lower electrode 105. In FIG. 10, the region corresponding to the area of B is hatched by horizontal wavy lines. In the present embodiment, the degree α of overlap between the cavity and the vibration member is defined as A/B. That is, α(=A/B) is given by (the area of the region where the opening of the cavity overlaps the vibration member)÷(the area of the region where the vibration member overlaps the substrate).

Figure 11:
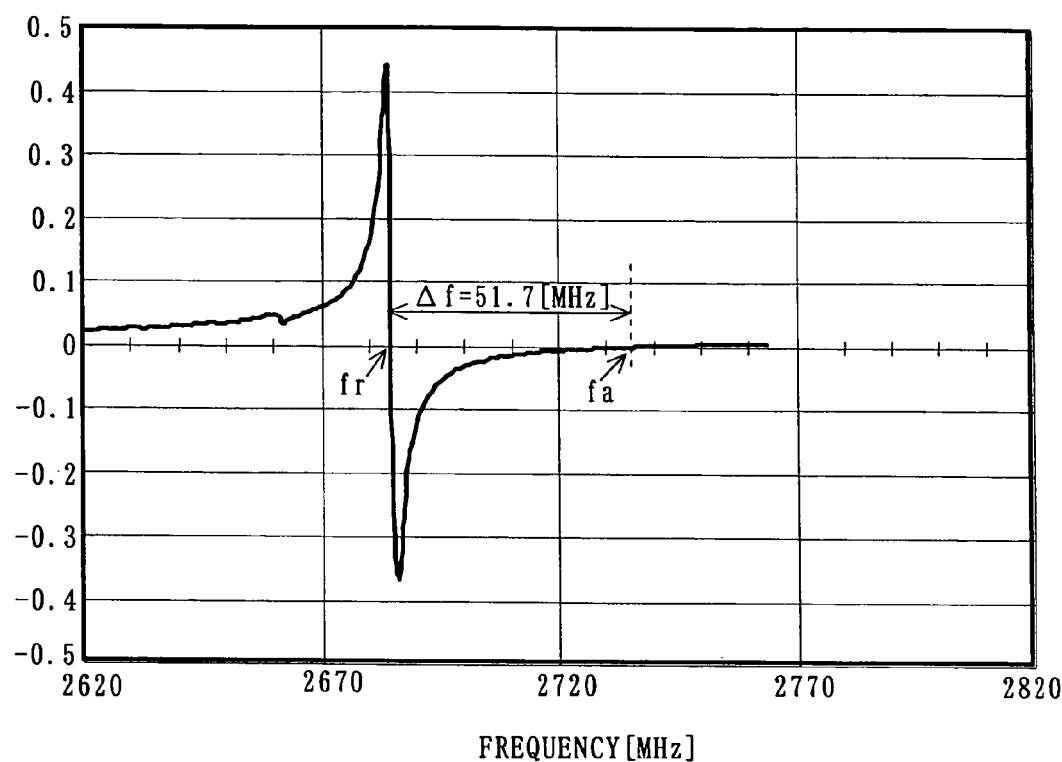
FIG. 11 is a graph showing a frequency-susceptance characteristic of the piezoelectric resonator shown in FIG. 10.

In FIG. 10, α=0.8. FIG. 11 is a graph showing a frequency-susceptance characteristic of the piezoelectric resonator shown in FIG. 10. In FIG. 11, there is no spurious resonance frequency between the resonance frequency fr and the anti-resonance frequency fa, and the frequency range Δf has a width of 51.7 [MHz]. Accordingly, it can be said that the condition where α=0.8 is preferable.

Figure 12A:
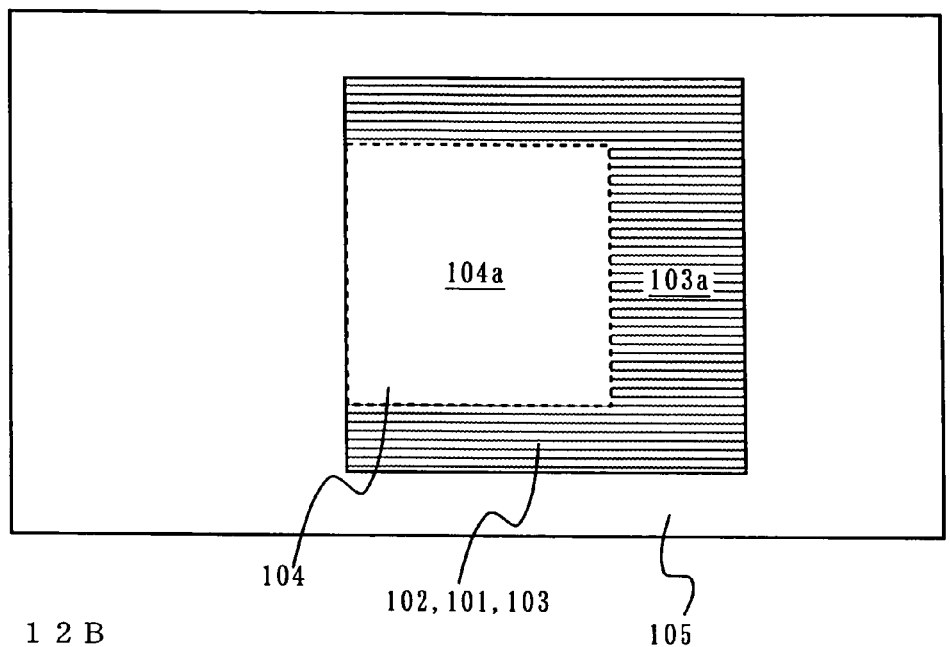
FIG. 12A is a top view of another piezoelectric resonator in the case where $\alpha=0.8$.
Figure 12B:
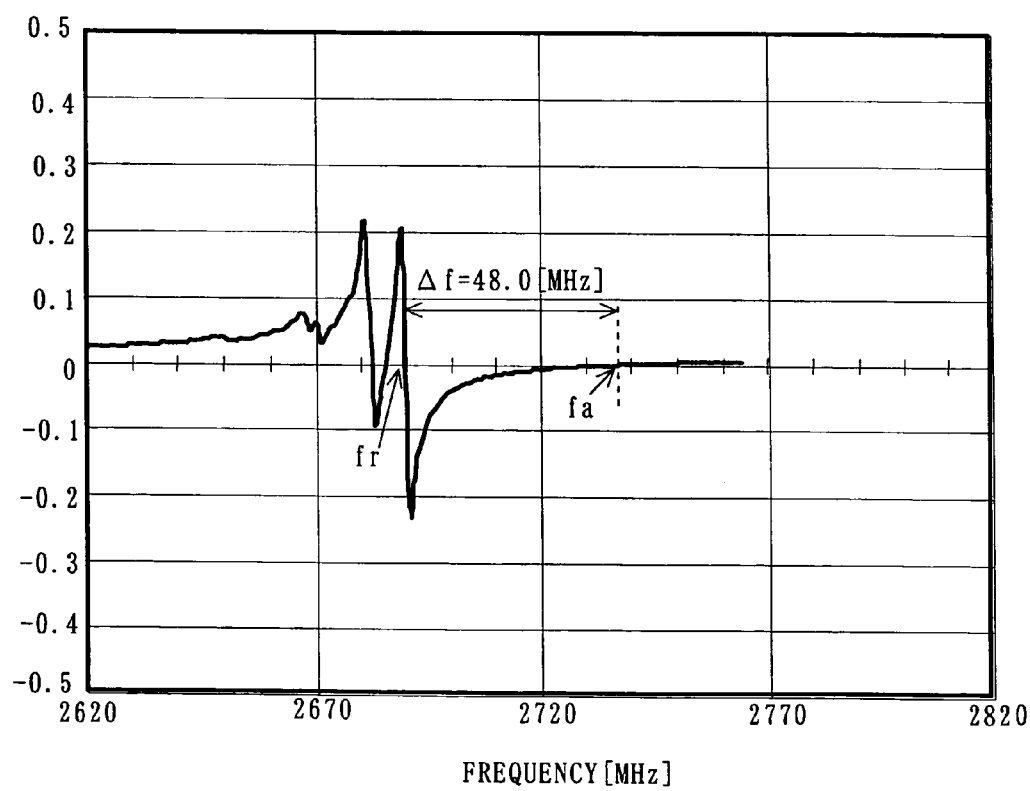
FIG. 12B is a graph showing a frequency-susceptance characteristic of the piezoelectric resonator shown in FIG. 12A.

FIG. 12A is a top view of another piezoelectric resonator in the case where α=0.8. The same reference numerals as those of FIG. 10 are applied in FIG. 12A. FIG. 12B is a graph showing a frequency-susceptance characteristic of the piezoelectric resonator shown in FIG. 12A. In FIG. 12B, there is no spurious resonance frequency between the resonance frequency fr and the anti-resonance frequency fa, and the frequency range Δf has a width of 48.0 [MHz]. Accordingly, as mentioned above, it can be said that the condition where α=0.8 is preferable.

Figure 13A:
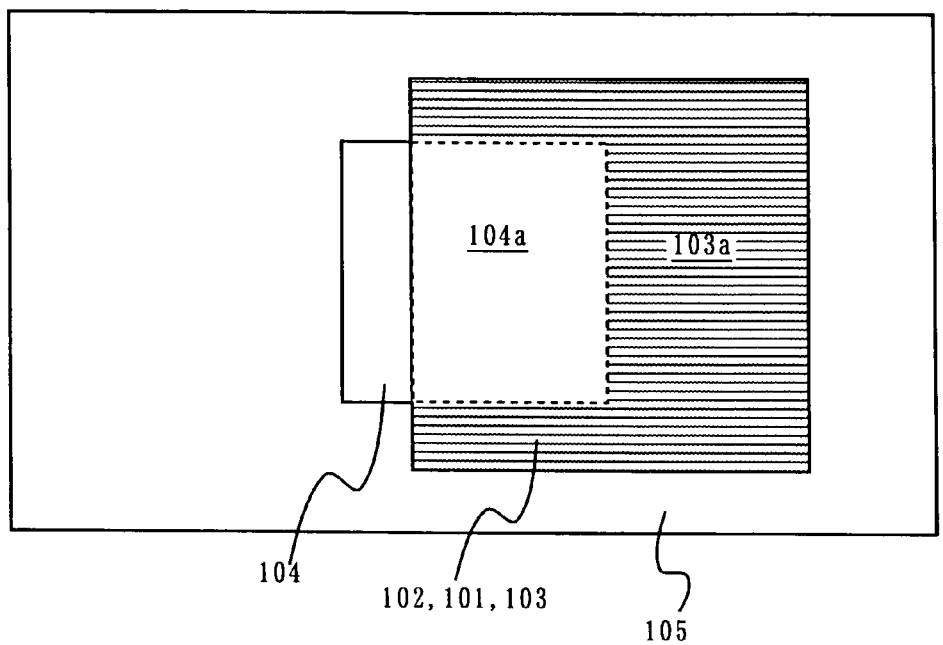
FIG. 13A is a top view of a piezoelectric resonator in the case where $\alpha=0.5$.
Figure 13B:
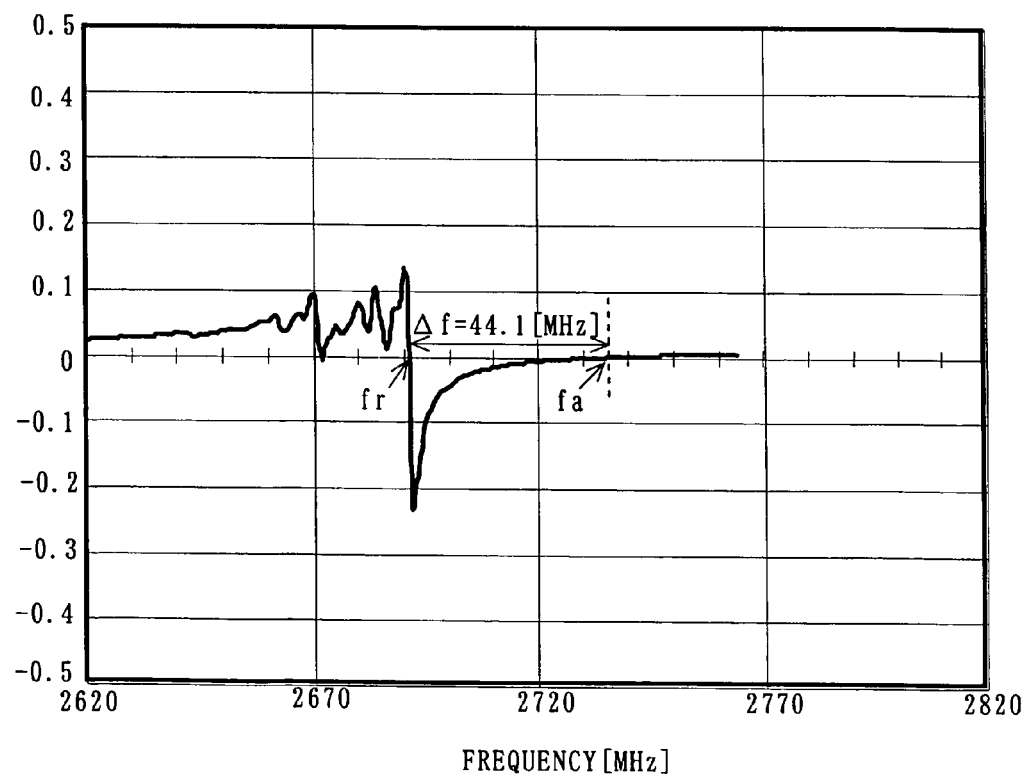
FIG. 13B is a graph showing a frequency-susceptance characteristic of the piezoelectric resonator shown in FIG. 13A.

FIG. 13A is a top view of a piezoelectric resonator in the case where α=0.5. The same reference numerals as those of FIG. 10 are applied in FIG. 13A. FIG. 13B is a graph showing a frequency-susceptance characteristic of the piezoelectric resonator shown in FIG. 13A. In FIG. 13B, there is no spurious resonance frequency between the resonance frequency fr and the anti-resonance frequency fa, and the frequency range Δf has a width of 44.1 [MHz]. Accordingly, it can be said that the condition where α=0.5 is preferable.

Figure 14A:
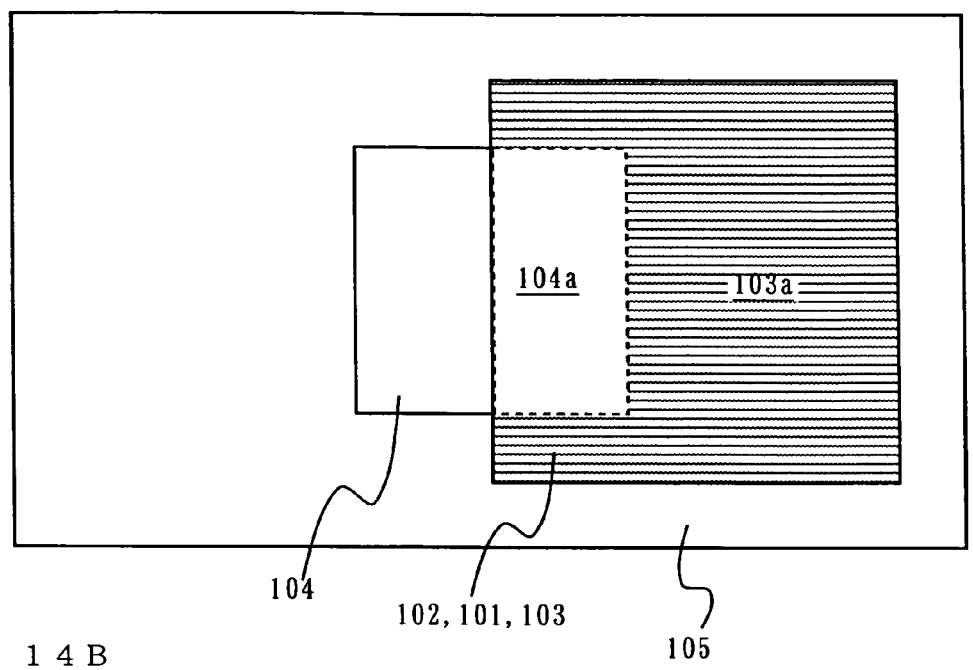
FIG. 14A is a top view of a piezoelectric resonator in the case where $\alpha=0.33$.
Figure 14B:
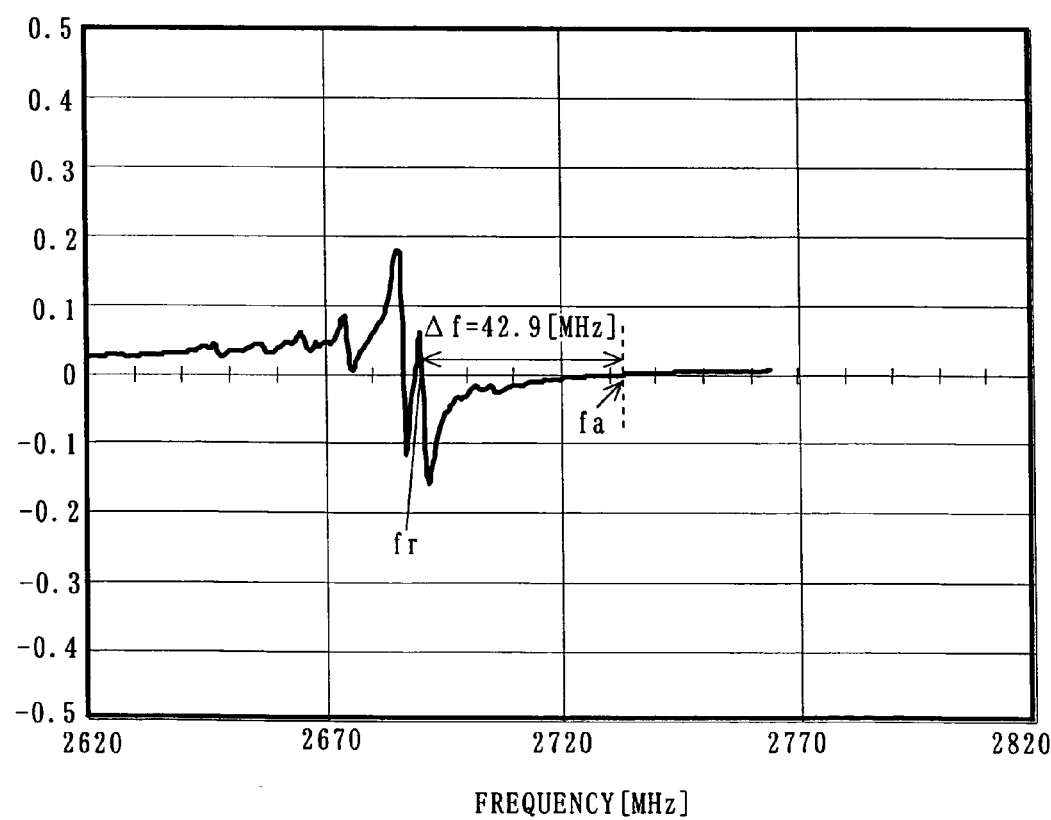
FIG. 14B is a graph showing a frequency-susceptance characteristic of the piezoelectric resonator shown in FIG. 14A.

FIG. 14A is a top view of a piezoelectric resonator in the case where α=0.33. The same reference numerals as those of FIG. 10 are applied in FIG. 14A. FIG. 14B is a graph showing a frequency-susceptance characteristic of the piezoelectric resonator shown in FIG. 14A. In FIG. 14B, the spurious resonance frequency slightly exists between the resonance frequency fr and the anti-resonance frequency fa. In this case, the frequency range Δf has a width of 42.9 [MHz].

From the foregoing, it is understood that in the case of the condition where α≧0.5, it is possible to obtain a wide frequency range Δf and control the spurious resonance frequency so as to be reduced to a more preferable level.

Thus, in the case where the value α, which is obtained by dividing the area of A of the region where the opening of the cavity overlaps the vibration member by the area of B of the region where the vibration member overlaps the substrate, is equal to or more than 0.5, it is possible to provide a piezoelectric resonator in which no spurious resonance frequency occurs between the resonance frequency and the anti-resonance frequency.

Note that in the first through seventh embodiments, the cavity is rectangular in cross section, i.e., the cavity has perpendicular walls. This is because in the case of the rectangular cross-sectional shape (perpendicular walls), it is possible to readily cause the resonance frequency of the vibration member and the resonance frequency of the cavity to agree with each other. However, in the present invention, the cavity does not have to be rectangular in cross section so long as the expression (7) is satisfied. For example, the cavity may be trapezoidal in cross section, and the cavity walls may be inclined.

Note that in the first through seventh embodiments, the piezoelectric member is provided on the lower electrode so as to be in close contact therewith. However, a dielectric member may be provided between the lower electrode and the piezoelectric member. That is, the piezoelectric member may be formed on or above the lower electrode. Alternatively, the dielectric member may be provided between the piezoelectric member and the upper electrode. That is, the upper electrode may be formed on or above the piezoelectric member. As such, in the case where the dielectric member is provided, the resonance frequency fr is determined by the thickness of the vibration member including the dielectric member.

Note that the piezoelectric member may be composed of a single-crystal bulk, rather than a film bulk material.

Note that in the case where the cavity walls and/or the supporting member are each composed of a plurality of materials, an average of ultrasonic velocity in the materials are used for calculating the vibration wavelength $\lambda c$.

Eighth Embodiment

Next, a structure of a ladder filter including piezoelectric resonators of the present invention is described with reference to FIG. 15.

Figure 15:
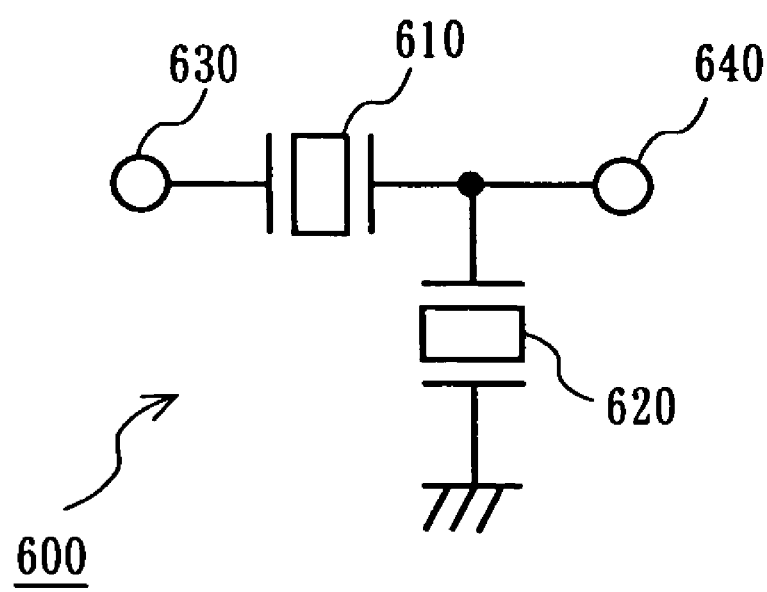
FIG. 15 is a diagram showing a structure of a ladder filter 600 according to an eighth embodiment of the present invention.

FIG. 15 is a diagram showing a structure of a ladder filter 600 according to an eighth embodiment of the present invention. In FIG. 10, the ladder filter 600 includes a first piezoelectric resonator 610, a second piezoelectric resonator 620, and input/output terminals 630 and 640. The first and second piezoelectric resonators 610 and 620 have a cavity which satisfies requirements as described in the first through third embodiment.

The first piezoelectric resonator 610 is connected in series between the input/output terminals 630 and 640. Accordingly, the first piezoelectric resonator 610 operates as a series resonator.

The second piezoelectric resonator 620 is connected in parallel between the input/output terminals 630 and 640, and is grounded at one end. Accordingly, the second piezoelectric resonator 620 operates as a parallel resonator.

A ladder filter of an L-shaped configuration is provided by connecting piezoelectric resonators in a manner as described above.

A resonance frequency of the first piezoelectric resonator 610 and a resonance frequency of the second piezoelectric resonator 620 are set so as to differ from each other. Specifically, the resonance frequency of the first piezoelectric resonator 610 is set so as to be higher than the resonance frequency of the second piezoelectric resonator 620. This realizes a ladder filter having a bandpass characteristic. Preferably, the resonance frequency of the first piezoelectric resonator 610 is set so as to be equal or close to an anti-resonance frequency of the second piezoelectric resonator 620, thereby realizing a ladder filter having a satisfactorily flatter bandpass.

Note that the thickness of the vibration member may be adjusted in order to configure a piezoelectric resonator having a desired resonance frequency.

Note that although the eighth embodiment has been described with respect to a single-stage ladder filter, the piezoelectric resonator of the present invention may be applied to a multistage ladder filter.

Note that while the eighth embodiment has been described with respect to a filter of an L-shaped configuration, an effect similar to that achieved by the filter of an L-shaped configuration can be achieved by a ladder filter of, for example, a T- or π-shaped configuration. It goes without saying that a similar effect can be achieved by a multistage filter of a T- or π-shaped configuration.

Further, a lattice filter can also achieve an effect similar to that achieved by a ladder filter. Specifically, the present invention is not limited to the above configuration, and any configuration can be used so long as the filter includes at least one piezoelectric resonator of the present invention.

Ninth Embodiment

A ninth embodiment of the present invention is described with respect to structures of an antenna duplexer which includes piezoelectric resonators of the present invention.

Figure 16:
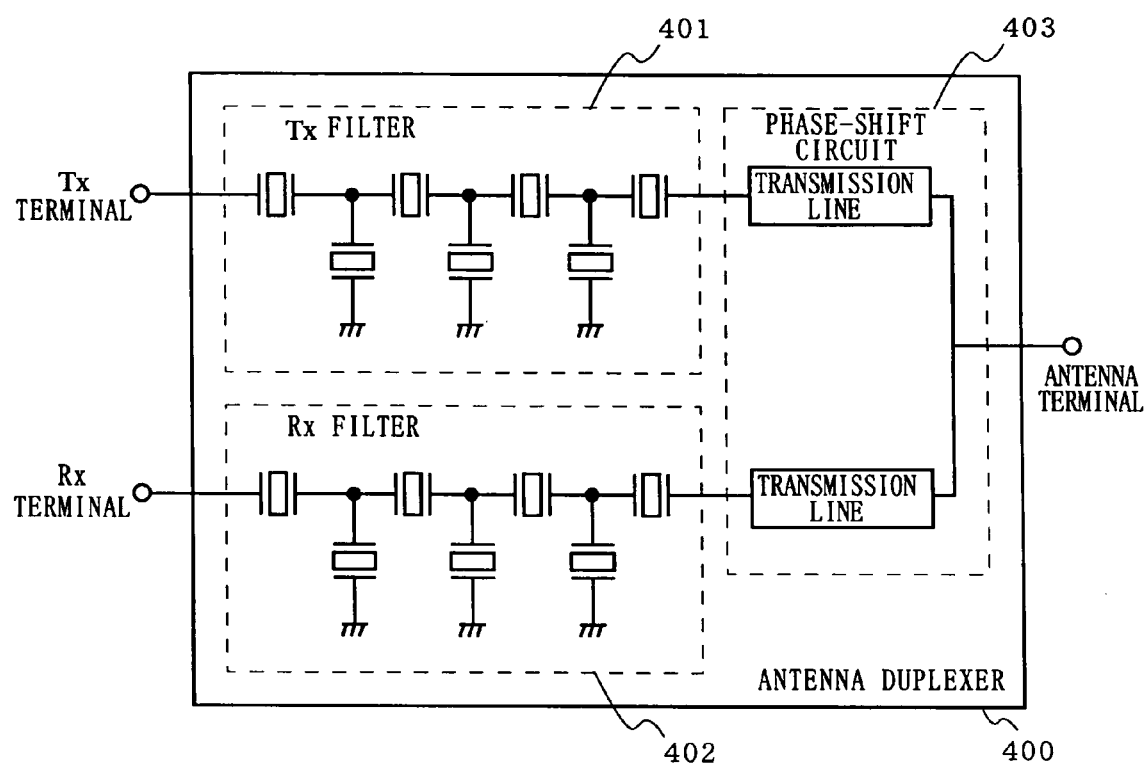
FIG. 16 is a diagram showing an exemplary structure of an antenna duplexer 400 according to a ninth embodiment of the present invention.

FIG. 16 is a diagram showing an exemplary structure of an antenna duplexer 400 according to the ninth embodiment of the present invention. In FIG. 16, the antenna duplexer 400 includes a Tx filter (transmission filter) 401, an Rx filter (reception filter) 402, and a phase-shift circuit 403. The Tx filter 401 and the Rx filter 402 include piezoelectric resonators of the present invention. The phase-shift circuit 403 consists of two transmission lines. The Tx filter 401 passes signals in a transmission frequency band, and attenuates signals in a reception frequency band. The Rx filter 402 passes signals in the reception frequency band, and attenuates signals in the transmission frequency band. This makes it possible to realize an antenna duplexer having satisfactory characteristics, such as a low-loss antenna duplexer. Note that the antenna duplexer is not limited by FIG. 11 in terms of the number of filters and the number of stages of the piezoelectric resonators included in the filters, and can be freely designed. Note that at least one of the piezoelectric resonators included in the Tx filter 401 and/or the Rx filter 402 may be a piezoelectric resonator of the present invention.

Tenth Embodiment

Figure 17:
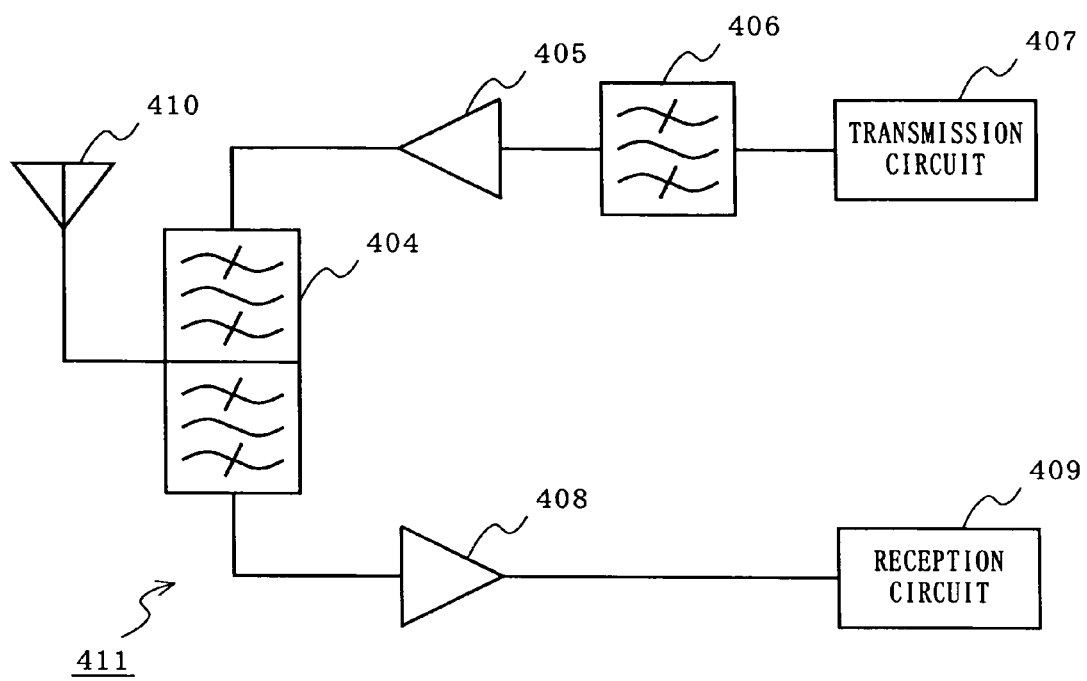
FIG. 17 is a diagram showing an exemplary structure of a communication device 411 according to a tenth embodiment of the present invention.
Figure 18A:
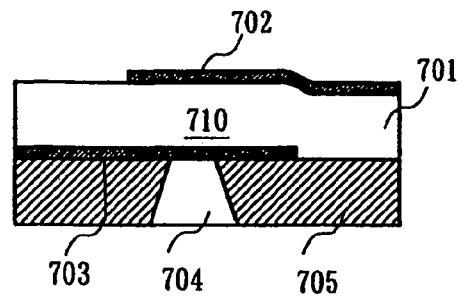
FIG. 18A is a cross-sectional view showing the basic structure of a conventional piezoelectric resonator.
Figure 18B:
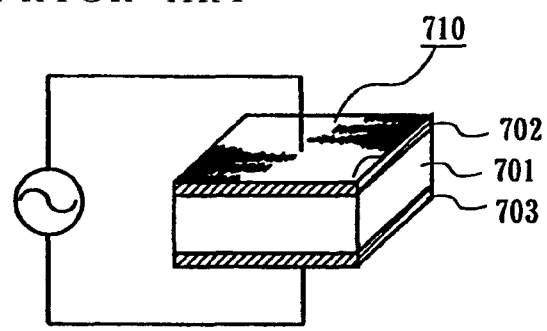
FIG. 18B is a schematic perspective view used for explaining an operation of a piezoelectric resonator 710.
Figure 18C:
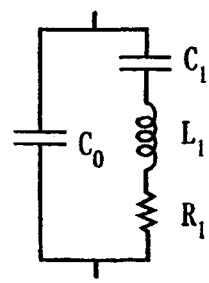
FIG. 18C is an equivalent circuit diagram of the piezoelectric resonator 710.
Figure 18D:
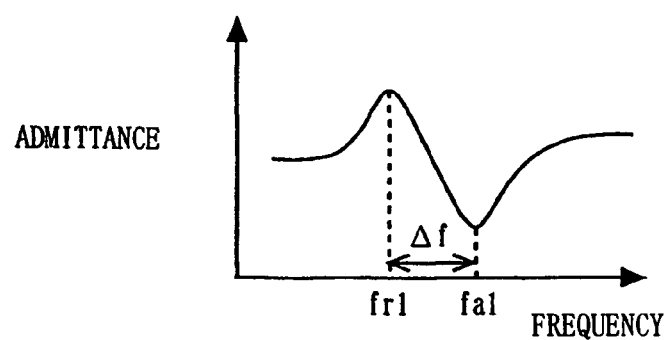
FIG. 18D is a graph showing frequency characteristics of admittance of the equivalent circuit shown in FIG. 18C.
Figure 19A:
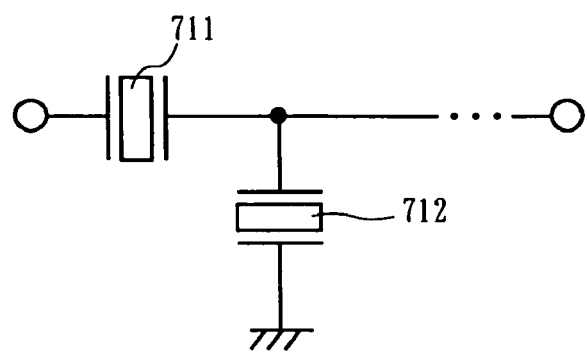
FIG. 19A is an equivalent circuit diagram of a filter including a piezoelectric resonator.
Figure 19B:
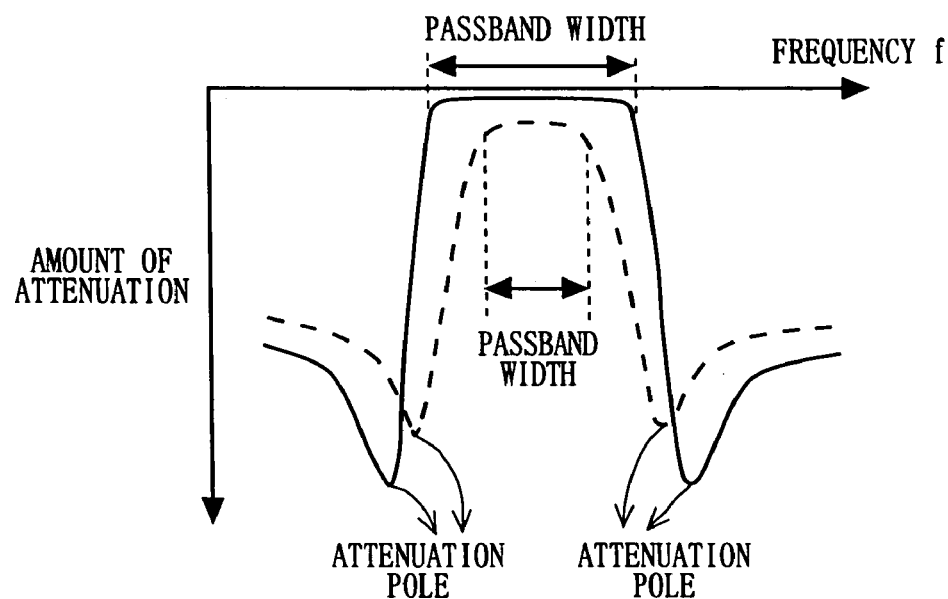
FIG. 19B is a graph showing band-pass characteristics of the filter shown in FIG. 19A.

FIG. 17 is a diagram showing an exemplary structure of a communication device 411 according to a tenth embodiment of the present invention. In FIG. 17, the communication device 411 includes an antenna duplexer 404, which is the same as that shown in FIG. 16, a transmission amplifier 405, a filter 406, a transmission circuit 407, a reception amplifier 408, a reception circuit 409, and an antenna 410. A transmission signal outputted by the transmission circuit 407 is inputted to the antenna duplexer 404 via the filter 406 and the transmission amplifier 405. The transmission signal inputted to the antenna duplexer 404 is transmitted via the antenna 410. A reception signal received by the antenna 410 is inputted to the reception circuit 409 via the antenna duplexer 404 and the reception amplifier 408. By using the above-described antenna duplexer 404 having satisfactory characteristics, such as low loss characteristics, it is possible to realize a compact and high-efficiency communication device. Note that the piezoelectric resonator of the present invention may be used in the filter 406. The communication device is not limited to that shown in FIG. 17, and can be freely designed. Note that the piezoelectric resonator of the present invention can be used not only in the duplexer or a filter at a transmission end and may be used in a filter at a reception end.

As described above, piezoelectric resonators of the present invention are used in an antenna duplexer or a communication device, thereby realizing an antenna duplexer or communication device having satisfactory characteristics.

A piezoelectric resonator of the present invention achieves a wide frequency range Δf and a high Q-factor, and therefore is advantageous if used in, for example, a mobile telephone, wireless communication, or wireless internet connection.

While the invention has been described in detail, the foregoing description is in all aspects illustrative and not restrictive. It is understood that numerous other modifications and variations can be devised without departing from the scope of the invention.

What is claimed is:

1. A piezoelectric resonator comprising:
   a substrate;
   a lower electrode provided on or above the substrate;
   a piezoelectric member provided on or above the lower electrode;
   an upper electrode provided on or above the piezoelectric member; and
   a cavity provided below a vibration member including the lower electrode, the piezoelectric member, and the upper electrode,
   wherein
   where a resonance frequency of vibration with a thickness of the vibration member being a half of a wavelength is taken as fr1, an average of ultrasonic velocity in a material forming the cavity is taken as Vc2, and a value determined based on the resonance frequency fr1 and the average of ultrasonic velocity Vc2 is λc (=Vc2/fr1), a depth t2 of the cavity is set as shown below, $$(2n-1) \times \frac{\lambda c}{4} - \frac{\lambda c}{8} \leq t2 \leq (2n-1) \times \frac{\lambda c}{4} + \frac{\lambda c}{8},$$

where n is an arbitrary natural number.

2. The piezoelectric resonator according to claim 1, wherein the depth t2 of the cavity is set as shown below, $$(2n-1) \times \frac{\lambda c}{4} - \frac{\lambda c}{16} \leq t2 \leq (2n-1) \times \frac{\lambda c}{4} + \frac{\lambda c}{16}.$$

3. The piezoelectric resonator according to claim 1, wherein the depth t2 of the cavity is set as shown below, $$t2 = (2n-1) \times \frac{\lambda c}{4}.$$

4. The piezoelectric resonator according to claim 1, wherein the cavity is rectangular in cross section.

5. The piezoelectric resonator according to claim 1, wherein a value obtained by dividing an area of a region where an opening of the cavity overlaps the vibration member by an area of a region where the vibration member overlaps the substrate, is equal to or greater than 0.5.

6. A method for producing a piezoelectric resonator comprising:
   providing a lower electrode on or above a substrate;
   providing a piezoelectric member on or above the lower electrode;
   providing an upper electrode on or above the piezoelectric member;
   providing a cavity below a vibration member including the lower electrode, the piezoelectric member, and the upper electrode; and
   determining a depth of the cavity, wherein where a resonance frequency of vibration with a thickness of the vibration member being a half of a wavelength is taken as fr1, an average of ultrasonic velocity in a material forming the cavity is taken as Vc2, and a value determined based on the resonance frequency fr1 and the average of ultrasonic velocity Vc2 is λc (=Vc2/fr1), a depth t2 of the cavity is set as shown below, $$(2n-1) \times \frac{\lambda c}{4} - \frac{\lambda c}{8} \leq t2 \leq (2n-1) \times \frac{\lambda c}{4} + \frac{\lambda c}{8},$$

where n is an arbitrary natural number.

7. The method for producing a piezoelectric resonator according to claim 6, wherein the providing of the cavity comprises etching the substrate, and stacking a supporting member on the substrate, so as to form the cavity having the depth t2 determined by the determining step.

8. The method for producing a piezoelectric resonator according to claim 6, wherein the providing of the cavity comprises etching a surface of the substrate to a depth greater than the depth t2 determined by the determining step, and providing an adjustment layer on the etched surface so as to form the cavity having the depth t2 determined by the determining step.

9. A filter comprising a plurality of piezoelectric resonators,
   wherein at least one of the piezoelectric resonators includes:
      a substrate;
      a lower electrode provided on or above the substrate;
      a piezoelectric member provided on or above the lower electrode;
      an upper electrode provided on or above the piezoelectric member; and
      a cavity provided below a vibration member including the lower electrode, the piezoelectric member, and the upper electrode, and
   wherein where a resonance frequency of vibration with a thickness of the vibration member being a half of a wavelength is taken as fr1, an average of ultrasonic velocity in a material forming the cavity is taken as Vc2, and a value determined based on the resonance frequency fr1 and the average of ultrasonic velocity Vc2 is λc (=Vc2/fr1), a depth t2 of the cavity is set as shown below, $$(2n-1) \times \frac{\lambda c}{4} - \frac{\lambda c}{8} \leq t2 \leq (2n-1) \times \frac{\lambda c}{4} + \frac{\lambda c}{8},$$

where n is an arbitrary natural number.

10. A duplexer comprising a filter including a plurality of piezoelectric resonators,
wherein at least one of the piezoelectric resonators includes:
a substrate;
a lower electrode provided on or above the substrate;
a piezoelectric member provided on or above the lower electrode;
an upper electrode provided on or above the piezoelectric member; and
a cavity provided below a vibration member including the lower electrode, the piezoelectric member, and the upper electrode, and
wherein where a resonance frequency of vibration with a thickness of the vibration member being a half of a wavelength is taken as fr1, an average of ultrasonic velocity in a material forming the cavity is taken as Vc2, and a value determined based on the resonance frequency fr1 and the average of ultrasonic velocity Vc2 is λc (Vc2/fr1), a depth t2 of the cavity is set as shown below, $$(2n-1) \times \frac{\lambda c}{4} - \frac{\lambda c}{8} \leq t2 \leq (2n-1) \times \frac{\lambda c}{4} + \frac{\lambda c}{8},$$

where n is an arbitrary natural number.

11. A communication device comprising a piezoelectric resonator,
wherein the piezoelectric resonator includes:
a substrate;
a lower electrode provided on or above the substrate;
a piezoelectric member provided on or above the lower electrode;
an upper electrode provided on or above the piezoelectric member; and
a cavity provided below a vibration member including the lower electrode, the piezoelectric member, and the upper electrode, and
wherein where a resonance frequency of vibration with a thickness of the vibration member being a half of a wavelength is taken as fr1, an average of ultrasonic velocity in a material forming the cavity is taken as Vc2, and a value determined based on the resonance frequency fr1 and the average of ultrasonic velocity Vc2 is λc (=Vc2/fr1), a depth t2 of the cavity is set as shown below, $$(2n-1) \times \frac{\lambda c}{4} - \frac{\lambda c}{8} \leq t2 \leq (2n-1) \times \frac{\lambda c}{4} + \frac{\lambda c}{8},$$

where n is an arbitrary natural number.

* * * * *

UNITED STATES PATENT AND TRADEMARK OFFICE
CERTIFICATE OF CORRECTION

PATENT NO. : 7,230,367 B2 Page 1 of 1
APPLICATION NO. : 10/979277
DATED : June 12, 2007
INVENTOR(S) : Hiroshi Yamaguchi et al.

It is certified that error appears in the above-identified patent and that said Letters Patent is hereby corrected as shown below:

In column 23, Claim 10, line 27 change "$\lambda c\ (Vc2/fr1)$" to --$\lambda c\ (=Vc2/fr1)$--.

Signed and Sealed this

Sixteenth Day of October, 2007

JON W. DUDAS
*Director of the United States Patent and Trademark Office*